(12) United States Patent
Chung et al.

(10) Patent No.: US 8,031,552 B2
(45) Date of Patent: Oct. 4, 2011

(54) MULTI-PORT MEMORY DEVICE WITH SERIAL INPUT/OUTPUT INTERFACE

(75) Inventors: Jin-Il Chung, Kyoungki-do (KR); Jae-Il Kim, Kyoungki-do (KR); Chang-Ho Do, Kyoungki-do (KR); Hwang Hur, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 12/717,011

(22) Filed: Mar. 3, 2010

(65) Prior Publication Data

US 2010/0169583 A1 Jul. 1, 2010

Related U.S. Application Data

(62) Division of application No. 11/824,440, filed on Jun. 29, 2007, now Pat. No. 7,701,800.

(30) Foreign Application Priority Data

Jun. 30, 2006 (KR) .............................. 2006-0061357

(51) Int. Cl.
G11C 8/00 (2006.01)

(52) U.S. Cl. .................................. 365/230.05; 365/222

(58) Field of Classification Search ............. 365/230.05, 365/222
See application file for complete search history.

(56) References Cited

U.S. PATENT DOCUMENTS

| 5,202,853 | A | 4/1993 | Choi |
| 5,796,745 | A | 8/1998 | Adams et al. |
| 5,829,015 | A | 10/1998 | Maeno |
| 7,089,465 | B2 | 8/2006 | Lee |
| 2005/0251713 | A1 | 11/2005 | Lee |
| 2005/0268167 | A1* | 12/2005 | Huott et al. ..................... 714/30 |

FOREIGN PATENT DOCUMENTS

| JP | 11-149771 A | 6/1999 |
| JP | 2005-322375 | 11/2005 |
| KR | 10-2005-0022855 A | 3/2005 |
| KR | 10-2007-0036608 A | 4/2007 |
| KR | 10-2007-0036610 A | 4/2007 |
| KR | 1020070036670 A | 4/2007 |
| TW | 392167 | 6/2000 |
| TW | I252974 | 4/2006 |
| TW | I254943 | 5/2006 |

* cited by examiner

*Primary Examiner* — Jason Lappas
(74) *Attorney, Agent, or Firm* — Blakely, Sokoloff, Taylor & Zafman

(57) ABSTRACT

A multi-port memory device includes ports, banks, a global data bus, an input/output (I/O) controller, mode register set (MRS), a clock generator, and a test I/O controller. The I/O controller transmits a test signal to the global data bus in response to a mode register enable signal. The MRS generates a test enable signal in response to the mode register enable signal and outputs a mode selection signal which determines a data transmission mode of a test I/O signal in response to the test signal. The clock generator receives an external clock and generates an internal clock based on the external clock in response to the mode selection signal. The test I/O controller inputs/outputs the test I/O signal in synchronism with the internal clock. The mode register enable signal active during a test operation mode for testing a core area of the banks.

6 Claims, 39 Drawing Sheets

FIG. 10

| M | | | IN | | | | | | | | | | | | | | | |
|---|---|---|---|---|---|---|---|---|---|---|---|---|---|---|---|---|---|---|
| 2 | 1 | 0 | 15 | 14 | 13 | 12 | 11 | 10 | 9 | 8 | 7 | 6 | 5 | 4 | 3 | 2 | 1 | 0 |
| L | L | L | L | L | L | L | H | L | R | R | R | DTT | | CL | MT1 | MT0 | LC | DTM |

MULTI-PORT MEMORY DEVICE WITH SERIAL INPUT/OUTPUT INTERFACE

CROSS-REFERENCE TO RELATED APPLICATIONS

The present patent application is a Divisional application claiming the benefit of application Ser. No. 11/824,440, filed Jun. 29, 2007 now U.S. Pat. No. 7,701,800.

The present invention claims priority of Korean patent application number 10-2006-0061357, filed on Jun. 30, 2006, which is incorporated by reference in its entirety.

BACKGROUND OF THE INVENTION

The present invention relates to a semiconductor memory device, and more particularly to a semiconductor memory device including a plurality of ports for transmitting information with external devices.

Most memory devices such as a random access memory (RAM) include only one port for transmitting data with external chipsets. The port is constituted with a plurality of input/output (I/O) pins. The memory device including a single port employs a parallel I/O interface for concurrently transmitting multi-bit data through a plurality of data lines connected to the plurality of I/O pins respectively. The I/O interface uses a data transmission scheme for transmitting data via data lines, each of which is connected between two devices. The data line uses a bus for transmitting signals such as an address signal, a data signal, and a control signal.

The parallel I/O interface provides a high data processing speed because it can simultaneously transmit multi-bit data through a plurality of data lines. Therefore, the parallel I/O interface is widely used in a short distance transmission that requires a high speed. However, because a large number of buses are included for the parallel I/O interface, a data transmission cost increases when the data transmission is performed between long distance. Due to the limitation of the single port, a plurality of memory devices is independently configured so as to support various multi-media functions in terms of hardware of a multi-media system. While an operation for a certain function is carried out, an operation for another function cannot be concurrently carried out. Considering the disadvantage of the parallel I/O interface, many attempts to change the parallel I/O interface into serial I/O interface have been made. Also, considering compatible expansion with devices having other serial I/O interfaces, the change to a serial I/O interface in an I/O environment of the semiconductor memory device is required. Moreover, appliance devices for audio and video are embedded into display devices, such as a high definition television (HDTV) and a liquid crystal display (LCD) TV. Because these appliance devices require independent data processing, there is a demand for multi-port memory devices having a serial I/O interface using a plurality of ports.

FIG. 1 is a block diagram of a multi-port memory device disclosed in commonly owned co-pending applications, Korean patent application Nos. 2005-90936 and 2006-32948, filed in the Korean Intellectual Property Office on Sep. 29, 2005 and on Apr. 11, 2006, entitled "multi-port memory device with serial input/output interface", which are incorporated herein by reference.

For convenience of explanation, the multi-port memory device having four ports and eight banks is illustrated. Particularly, it is assumed that the multi-port memory device has 16-bit data frame and performs a 64-bit prefetch operation.

As shown, the multi-port memory device includes first to fourth ports PORT0 to PORT3, first to eighth banks BANK0 to BANK7, first and second global input/output (I/O) data buses GIO_OUT<0:3> and GIO_IN<0:3>, and first to eighth bank control units BC0 to BC7. Each of the ports PORT0 to PORT3 located at a center of the multi-port memory device is arranged in a row direction, and performs a serial data communication with its own external device. The first to eighth banks BANK0 to BANK7 are classified into upper banks BANK0 to BANK3 and lower banks BANK4 to BANK7 based on their relative location with the first to fourth ports PORT0 to PORT3. The first global I/O bus GIO_OUT<0:3> is arranged in the row direction between the upper banks BANK0 to BANK3 and the first to fourth ports PORT0 to PORT3, and transmits output data in parallel. The second global I/O bus GIO_IN<0:3> is arranged in the row direction between the lower banks BANK4 to BANK7 and the first to fourth ports PORT0 to PORT3, and transmits input data in parallel. The first to eighth bank control units BC0 to BC7 control a signal transmission between the first and second global I/O buses GIO_OUT<0:3> and GIO_IN<0:3> and the first to eighth banks BANK0 to BANK7.

FIG. 2 is detailed block diagram of the first bank BANK0 shown in FIG. 1. The other banks BANK1 to BANK7 have the same structure with that of the first bank BANK0.

The first bank BANK0 includes a memory cell array 10, row and column decoders 11 and 12, a write driver (W/D) 13, a data bus sense amplifier (DBSA) 14, and an equalizer (not shown). The memory cell array 10 includes a plurality of memory cells MCs arranged with an N by M matrix form, M and N being positive integers. Each of the row and column decoders 11 and 12 selects one of the memory cells MCs by a row and a column. The first to eighth banks BANK0 to BANK7 having such a constitution divide the multi-port memory device by half based on the first to fourth ports PORT0 to PORT3 so that the upper banks BANK0 to BANK3 and the lower banks BANK4 to BANK7 are symmetrically located at the row direction.

FIG. 3 is a block diagram of the first port PORT0 illustrated in FIG. 1. Each port PORT0 to PORT3 located at the center of the multi-port memory device is connected to the first and second global I/O data buses GIO_OUT<0:3> and GIO_IN<0:3> so as to independently access all banks. The other ports PORT1 to PORT3 have the same structure with that of the first port PORT0, and thus, the first port PORT0 is explained as an example.

As shown, the first port PORT0 includes a reception unit 41 and a transmission unit 42. The reception unit 41 receives signals input from the external devices through reception pad RX, and the transmission unit 42 outputs signals output from the first to eighth banks BANK0 to BANK7 through a transmission pad TX. Hereinafter, the signals input from the external devices is referred to "input signals" and the signals output from the first to eighth banks BANK0 to BANK7 are referred to "output signals". The reception unit 41 and the transmission unit 42 operate independently so that the input signals and the output signals are simultaneously transmitted.

In detail, the reception unit 41 deserializes 20-bit input signals input in series to convert and output the deserialized input signals as 26-bit valid signals effective for an operation of the DRAM device. Herein, the 26-bit valid signals include an 8-bit port/bank selection signal group P0_BK<0:7>, and a 18-bit input valid data signal group P0_RX<0:17>. The 18-bit input valid data signal group P0_RX<0:17> includes a command flag signal, a row address strobe/data mask (RAS/DM) signal, and 16-bit command/address/data signals.

Herein, the 16-bit command/address/data signals may be addresses, commands or data signals.

FIGS. 4A to 4F are frame formats of the input signals input to the first port PORT0 shown in FIG. 3. FIG. 4A is a basic frame format; FIG. 4B is a write command frame format; FIG. 4C is a write data frame format; FIG. 4D is a read command frame format; FIG. 4E is a read data frame format; and FIG. 4F is a command frame format.

As an example, the write command frame and the write data frame shown in FIGS. 4B and 4C are described in detail.

Referring to FIG. 4B, the write command frame is a unit of 20-bit serialized signals input from the external devices. 18th and 19th bits PHY among the 20-bit serialized signals correspond to a physical link coding bit, a 17th bit CMD means a command start point, a 16th bit ACT means an internal active state, a 15th bit WT corresponds to an internal write command, and a 14th bit PCG means an internal inactive state. For example, during a normal write operation, 17th to 14th bits become "1010". During an auto-precharge write operation, 17th to 14th bits become "1011". 13th to 10th bits UDM are used as an upper-byte write data mask signal of write data input during four clocks, 9th to 6th bits BANK mean bank data written during a write operation, and the 5th to 0th bits COLUMN ADDRESS mean a column address. The write data frame shown in FIG. 4C is input during four clocks after the write command frame shown in FIG. 4B is input. Herein, a 17th bit CMD becomes a logic level "LOW", a 16th bit LDM are used as a lower-byte write data mask signal of the write data, and each of 15th to 8th bits UPPER BYTE and 7th to 0th bits LOWER BYTE means an upper byte and a lower byte of the write data, respectively.

Referring to FIGS. 3 to 4F, detailed constitutions of the reception unit 41 and the transmission unit 42 are described.

The reception unit 41 includes a deserializer 411, a command generation unit 412, a bank address generation unit 413, a bank address output unit 414, and a valid input data output unit 415. The deserializer 411 deserializes the 20-bit input signals, i.e., one frame, input from the external devices through the reception pad RX in series and outputs the deserialized input signals as 20-bit parallel signals. The command generation unit 412 determines an operation of the 20-bit parallel signals by using the 17th bit CMD of the 20-bit parallel signals output from the deserializer 411. That is, if the 17th bit CMD of the write command frame shown in FIG. 4B is a logic level "LOW", the command generation unit 412 determines the 20-bit parallel signals performs a write operation; and if the 17th bit CMD is a logic level "HIGH", the command generation unit 412 determines the 20-bit parallel signals performs a read operation. Further, the command generation unit 412 outputs a bank information bit utilized as bank data of the 20-bit parallel signals. Herein, the number of the bank information bit is three because the number of banks is eight, and this bit is included in a frame payload shown in FIG. 4A. The bank address generation unit 413 outputs 8-bit bank addresses for selecting a corresponding bank among the first to eighth banks BANK0 to BANK7 based on the 3-bit bank information bit. The bank address generation unit 413 may include a 3 by 8 decoder which outputs 8-bit output signals by receiving 3-bit input signals. The bank address output unit 414 outputs the 8-bit port/bank selection signal group P0_BK<0:7> to the second global I/O data bus GIO_IN<0:3> based on the 8-bit bank addresses input from the bank address generation unit 413. The bank address output unit 414 may include a plurality of output drivers. The valid input data output unit 415 outputs the 18-bit valid input data signal group P0_RX<0:17> to the second global I/O data bus GIO_IN<0:3> based on output signals from the deserializer 411. The valid input data output unit 415 may include a plurality of output drivers.

The transmission unit 42 receives and serializes a valid output data signal group P0_DATA<0:15> output from the banks through the first global data bus GIO_OUT<0:3> in parallel to output the serialized signals to the transmission pad TX. In detail, the transmission unit 42 includes a serializer 421 and a valid output data input unit 422. The valid output data input unit 422 receives the 16-bit valid output data signal group P0_DATA<0:15> input from the banks through the first global data bus GIO_OUT<0:3>, and makes them fit for a transmission protocol under the control of the command generation unit 412, i.e., according to the read or write operation. As a result, 20-bit frame output signals are output. The valid output data input unit 422 may include a plurality of input drivers. The serializer 421 serializes the 20-bit frame output signals input from the output valid data input unit 422 in parallel, and outputs the serialized signals to the transmission pad TX in series.

Meanwhile, the first global I/O data bus GIO_OUT<0:3> includes 64-bit buses, i.e., 16 by 4, for transmitting the valid output data signal group Pi_DATA<0:15> input from the banks to each port independently. Herein, "16" is the number of data bits and "4" is the number of ports. The second global I/O data bus GIO_IN<0:3> includes 104-bit buses, i.e., 26 by 4, for transmitting the valid input data signal group Pi_RX<0:17> and the port/bank selection signal group Pi_BK<0:7> input from the ports to each bank independently. Herein, the "i" corresponds to the number of ports as an integer from 0 to 3. The first and second global I/O data buses GIO_OUT<0:3> and GIO_IN<0:3> are connected to plurality of local data buses for transferring signals with each bank control unit or each port. The local data buses connect the first and second global I/O data buses GIO_OUT<0:3> and GIO_IN<0:3> to the first to eighth bank control units BC0 to BC7 or the first to fourth ports PORT0 to PORT3. For convenience of explanation, the local data buses are classified into first to fourth local data buses.

FIG. 5 is a detailed block diagram of the first bank control unit BC0 shown in FIG. 1. Each of the first to eighth bank control units BC0 to BC7 is arranged for a corresponding one of the first to eighth banks BANK0 to BANK7 to thereby control transferring signals between the corresponding bank and each port PORT0 to PORT3. The bank control units BC1 to BC7 have the same structure with that of the first bank control unit BC0, and thus, the first bank control unit BC0 is explained as an example.

Referring to FIG. 5, the first bank control unit BC0 includes a deserializer 61, a serializer 62, a state machine unit 63, an input signal state discrimination unit 64, a bank selection unit 65, and a port selection unit 66.

The bank selection unit 65 selects one signal group of a plurality of the 18-bit valid input data signal groups Pi_RX<0:17> output from each port in response to a 8-bit bank selection signal group BK0_P<0:3> and transmits it as a 18-bit bank valid data signal group B0_RX<0:17> to the first bank BANK0. Herein, the 4-bit bank selection signal group BK0_P<0:3> is part of the 8-bit port/bank selection signal group Pi_BK<0:7>. That is, the bank selection unit 65 receives 22-bit signals including the 4-bit bank selection signal group BK0_P<0:3> and the 18-bit input valid data signal group Pi_RX<0:17> from all ports through the second global I/O data bus GIO_IN<0:3> to thereby output the 18-bit bank valid data signal group B0_RX<0:17> corresponding to the first bank BANK0.

A 16-bit signal group of the 18-bit bank valid data signal group B0_RX<0:17> is used as data, addresses or commands such as a bank mode determination signal; a 1-bit signal is used as an active flag signal; and a 1-bit signal is used as a command flag signal for discriminating whether the 16-bit signal group is data signals or not. For instance, a seventeenth bank valid data signal B0_RX<16> of the 18-bit bank valid data signal group B0_RX<0:17> is used as the active flag signal and an eighteenth bank valid data signal B0_RX<17>, i.e., a most significant bit (MSB), is used as the command flag signal. Herein, the seventeenth bank valid data signal B0_RX<16> is used as the row address strobe/data mask (RAS/DM) signal, and the eighteenth bank valid data signal B0_RX<17> is used as an enable signal of the state machine unit 63. For reference, the RAS signal is an initial signal of the DRAM device as a chip enable signal for controlling an operation of the DRAM device.

The input signal state discrimination unit 64 receives the 18-bit bank valid data signal group B0_RX<0:17> and discriminates whether it is data, addresses or commands. In detail, the input signal state discrimination unit 64 discriminates whether the 16-bit signal group B0_RX<0:15> is data, addresses or commands based on status of the most significant bit (MSB) B0_RX<17>. When the 16-bit signal group B0_RX<0:15> is discriminated as data, the 16-bit signal group B0_RX<0:15> is transferred to the deserializer 61. Otherwise, the 18-bit bank valid data signal group B0_RX<0:17> is transferred to the state machine unit 63.

The state machine unit 63 outputs an address/command signal ADD/CON based on the 18-bit bank valid data signal group B0_RX<0:17>. The address/command signal ADD/CON controls the operation of the DRAM device and includes internal command signals, internal address signals, and internal control signals. The internal command signals include an internal active signal ACT, an internal inactive state PCG, an internal read command signal READ, and an internal write command signal WRITE. The internal address signals include a row address XADD and a column address YADD. The internal control signals include an input data strobe clock such as DSTROBE16<0:3> and DSTROBE64, a driving enable signal group DRVEN_P<0:3>, a pipe input strobe signal PINSTROBE, and a pipe output control signal group POUT<0:3>.

The deserializer 61 converts the 16-bit signal group B0_RX<0:15> into 64-bit parallel output data and outputs it to the write driver (W/D) 13 of the corresponding bank. Herein, though the 16-bit signal group B0_RX<0:15> has a parallel form, it has to be converted into the 64-bit parallel output data because each memory cell of the banks performs a read or write operation with 64-bit data.

The serializer 62 converts 64-bit data signals output from the plurality of the DBSAs 14 into a 16-bit output data signal group DO<0:15>_B0 in response to the pipe input strobe signal PINSTROBE and the pipe output control signal group POUT<0:3>.

The port selection unit 66 sequentially receives the 16-bit output data signal group DO<0:15>_B0 output from the serializer 62 in units of 16-bits and outputs the valid data signal group Pi_DATA<0:15> to a corresponding port selected by decoding a 4-bit port selection signal group BRX_P<0:3>. Herein, the 4-bit port selection signal group BRX_P<0:3> is part of the 8-bit port/bank selection signal group Pi_BK<0:7>. The port selection unit 66 includes four demultiplexers. Each demultiplexer is allocated to each port so as to independently perform a signal transmission with all ports PORT0 to PORT3. Further, each demultiplexer includes sixteen drivers for processing the 16-bit output data signal group DO<0:15>.

FIG. 6 is a circuit diagram of the state machine unit 63 shown in FIG. 5.

The state machine unit 63 includes a command generating unit 631, an input data strobe generating unit 632, a row address generating unit 633, a column address generating unit 634, a read data pipe controller 635, and a data output controller 636.

The command generating unit 631 is enabled in response to two MSB bank valid data signals B0_RX<16:17> and generates the internal command signals such as the internal active signal ACT, the internal inactive state PCG, the internal read command signal READ, and the internal write command signal WRITE by decoding the other 16-bit signal group B0_RX<0:15>. The command generating unit 631 includes a decoder for generating 2n digital signals by receiving n digital signals, n being a positive integer. The input data strobe generating unit 632 generates the input data strobe signal such as DSTROBE16<0:3> and DSTROBE64 in response to the eighteenth bank valid data signal B0_RX<17> and the internal write command signal WRITE. Herein, the input data strobe signal such as DSTROBE16<0:3> and DSTROBE64 are control signals for controlling an operation of the deserializer 61. The row address generating unit 633 receives the bank valid data signal group BRX<0:m> to generate a row address group XADD<0:m> in response to the internal active signal ACT, m being a positive integer. The column address generating unit 634 receives the bank valid data signal group BRX<0:n> to generate a column address group YADD<0:n> in response to the internal read command signal READ and the internal write command signal WRITE, n being a positive integer. The read data pipe controller 635 generates the pipe input strobe signal PINSTROBE and the pipe output control signal group POUT<0:3> in response to the internal read command signal READ. The data output controller 636 receives the port selection signal group BRX_P<0:3> to generate the driving enable signal group DRVEN_P<0:3> in response to the internal read command signal READ. Herein, the driving enable signal group DRVEN_P<0:3> is a control signal for controlling an operation of the port selection unit 66.

Hereinafter, an operation of the conventional multi-port memory device will be explained in detail.

FIG. 7 is a signal diagram illustrating a signal input path from the ports to the banks, and FIG. 8 is a signal diagram illustrating a signal output path from the banks to the ports. Herein, the signal input path is related to the 8-bit port/bank selection signal group Pi_BK<0:7> and the 18-bit input valid data signal group Pi_RX<0:17>, and the signal output path is related to the valid data signal group Pi_data<0:15>.

First, the signal input path from the first port PORT0 to the second bank BANK1 is described.

Referring to FIG. 7, the 20-bit input signals are input from the external devices to each port through the reception pad RX in series. Each port converts the 20-bit input signals into the 26-bit valid signals including the 8-bit port/bank selection signal group Pi_BK<0:7> and the 18-bit input valid data signal group Pi_RX<0:17>, and outputs them to the second global I/O data bus GIO_IN<0:3>. At this time, the second global I/O data bus GIO_IN<0:3> is connected to the other banks, i.e., BANK0 and BANK2 to BANK7, as well as the second bank BANK1 through a second local I/O data bus LIO_BIN shown in FIG. 1. As a result, the 26-bit valid signals are transferred to the bank selection unit 65 of all bank control units BC0 to BC7 through the second local I/O data bus LIO_BIN.

In this time, because the 18-bit input valid data signal group P0_RX<0:17> output from the first port PORT0 is only transferred to the second bank BANK1, the 8-bit port/bank selection signal group P0_BK<0:7> is required to prevent the 18-bit input valid data signal group P0_RX<0:17> from being transferred to the other banks BANK0 and BANK2 to BANK7.

The bank selection unit 65 of the second bank control unit BC1 receives the 18-bit input valid data signal group P0_RX<0:17> in response to the 4-bit bank selection signal group BK1_P<0:3>, and transfers it as the 18-bit bank valid data signal group B1_RX<0:17> to the second bank BANK1. At this time, the other bank selection signal groups BK0_P<0:3> and BK2_P<0:3> to BK7_P<0:3> are inactivated so that the bank selection unit 65 of the other bank control units, i.e., BC0 and BC2 to BC7, does not operate. As a result, the 18-bit input valid data signal group P0_RX<0:17> is not transferred to the other banks BANK0 and BANK 2 to BANK7.

Second, the signal output path from the second bank BANK1 to the first port PORT0 is described.

Referring to FIG. 8, the serializer 62 of the second bank control unit BC1 serializes the 61-bit data signals output from the second bank BANK1 and outputs the 16-bit output data signal group DO<0:15>_B1 to the demultiplexers of port selection unit 66. The demultiplexers receive the 16-bit output data signal group DO<0:15>_B1 to output it as the 16-bit valid output data signal group P0_DATA<0:15> to the first global I/O data bus GIO_OUT<0:3> in response to a first driving enable signal DRVEN_P<0> of the driving enable signal group DRVEN_P<0:3>. The 16-bit valid output data signal group P0_DATA<0:15> loaded to the first global I/O data bus GIO_OUT<0:3> is transferred to the first port PORT0 through a third local I/O data bus LIO_P1.

Third, a normal read operation of the multi-port memory device is explained. The normal read operation means to fetch data from a specific address of a corresponding bank.

If the read command frame format or the read data frame format shown in FIGS. 4D and 4E is input to the first port PORT0 through the reception port RX in series, the first port PORT0 parallelizes and converts the input signals into the 26-bit valid signals. The 26-bit valid signals are input to the bank selection unit 65 of the second bank control unit BC1 through the second global I/O data bus GIO_IN<0:3>. At this time, because the bank selection unit 65 is connected with the second global I/O data bus GIO_IN<0:3> and the second local I/O data bus LIO_BIN shown in FIG. 2, the bank selection unit 65 of the second bank control unit BC1 receives the 26-bit valid signals from the other parts PORT1 to PORT3 as well as the first port PORT0. Accordingly, the 26-bit valid signals includes the 8-bit port/bank selection signal group Pi_BK<0:7> to select required bank, and each bank selection unit 65 selects the required bank based on the 8-bit port/bank selection signal group Pi_BK<0:7>. Herein, a bank selection signal corresponding to the second bank BANK1 is only activated, and thus, the bank selection unit 65 of the second bank control unit BC1 receives the 18-bit input valid data signal group P0_RX<0:17> from the first port PORT0.

The state machine unit 63 of the second bank control unit BC1 activates the internal active signal ACT and the internal read command signal READ based on the 18-bit input valid data signal group P0_RX<0:17>. The row and column address generating units 633 and 634 of the state machine unit 63 generate the row and column addresses XADD and YADD of the second bank BANK1 based on the internal active signal ACT and the internal read command signal READ. The read data pipe controller 635 activates the pipe input strobe signal PINSTROBE and the pipe output control signal group POUT<0:3>, and the data output controller 636 activates the driving enable signal group DRVEN_P<0:3>. The 64-bit data signals are amplified by the plurality of the DBSAs 14 of the second bank BANK1 and are output to the serializer 62 according to the column address YADD in response to the internal read command signal READ.

The serializer 62 serializes the 64-bit data signals output from the plurality of the DBSAs 14 to output to 16-bit output data signal group DO<0:15>_B1 in response to the pipe input strobe signal PINSTROBE and the pipe output control signal group POUT<0:3>. That is, the serializer 62 converts the 64-bit data signals into the 16-bit output data signal group DO<0:15>_B1 in units of four, and sequentially outputs the 16-bit output data signal group DO<0:15>_B1 to the port selection unit 66.

The port selection unit 66 receives the 16-bit output data signal group DO<0:15>_B1 and outputs the valid data signal group Pi_DATA<0:15> to the first port PORT0 through the first global I/O data bus GIO_OUT<0:3> in units of 16-bit based on the driving enable signal group DRVEN_P<0:3> which is generated by decoding the 4-bit port selection signal group BRX_P<0:3>. Referring to FIG. 4, the first port PORT0 serializes and outputs the valid data signal group Pi_DATA<0:15> to the external devices through the transmission pad TX.

Fourth, a normal write operation of the multi-port memory device is explained. The normal write operation means to write data to a specific address of a corresponding bank. Input signals of the conventional multi-port memory device having five frame formats are input through the reception pad RX during the normal write operation. A first frame is a command frame shown in FIG. 4B, and the other frames are data frames shown in FIG. 4C. Each frame includes 16-bit data, and thus, a total frame includes 64-bit data.

The command and data frame formats are consecutively input to the first port PORT0, the deserializer 411 of she first port PORT0 deserializes and converts each frame format into the 26-bit valid signals. The bank selection unit 65 of the second bank control unit BC1 receives the 26-bit valid signals input from the first port PORT0 through the second global I/O data bus second global I/O data bus GIO_IN<0:3>. At this time, because the bank selection unit 65 of the second bank control unit BC1 is connected with the second global I/O data bus GIO_IN<0:3> and the second local I/O data bus LIO_BIN shown in FIG. 2, the bank selection unit 65 of the second bank control unit BC1 receives the 26-bit valid signals from the other ports PORT1 to PORT3 as well as the first port PORT0. Accordingly, the 26-bit valid signals includes the 8-bit port/bank selection signal group Pi_BK<0:7> to select a required bank, and each bank selection unit 65 selects the required bank based on the 8-bit port/bank selection signal group Pi_BK<0:7>. Herein, a bank selection signal corresponding to the second bank BANK1 is only activated, and thus, the bank selection unit 65 of the second bank control unit BC1 receives the 18-bit input valid data signal group P0_RX<0:17> from the first port PORT0.

The state machine unit 63 of the second bank control unit BC1 activates the internal active signal ACT and the internal write command signal WRIRE based on the 18-bit input valid data signal group P0_RX<0:17>. The row and column address generating units 633 and 634 of the state machine unit 63 generate the row and column addresses XADD and YADD of the second bank BANK1, and the input data strobe generating unit 632 generates the input data strobe signals DSTROBE16<0:3> and DSTROBE64 in response to the eighteenth bank valid data signal BRX<17>, the internal active signal ACT and the internal write command signal WRITE. Then, after the other data frames are consecutively input, the deserializer 61 of the second bank control unit BC1 converts the 16-bit signal group B1_RX<0:15> relating to the 18-bit input valid data signal group P0_RX<0:17> into the 64-bit parallel output data. The write driver (W/D) 13 of the second bank BANK1 writes the 64-bit parallel output data to the memory cell array 10.

During the normal write operation, if four frames including a data frame are consecutively input, 64 data bits are written to the memory cell array at the same time. However, before all of the four frames are input, another command can be performed by an interrupt. At this time, data input before the interrupt is performed are only written to the memory cell array.

Tests for the multi-port memory device described above are performed through the ports which provide a high data process speed. However, most DRAM test devices currently used cannot support the high data process speed provided by the ports. Further, when the ports operate erroneously, it is impossible to test the multi-port memory device correctly. Therefore, it is very advantageous to perform tests for the multi-port memory device independent of the ports.

When the test operation is performed through the ports of a high at process speed by using a test device providing a low data process speed, a test time for the multi-port memory device increases. In case that the test operation is required to be performed through the ports, the serial I/O interface of the high data process speed has to be converted to the parallel I/O interface of the low data process speed in order to reduce the test time.

SUMMARY OF THE INVENTION

Embodiments of the present invention are directed to provide a multi-port memory device performing a dynamic random access memory (DRAM) core test operation without passing through ports. The multi-port memory device uses input/output (I/O) pads for performing a serial data transmission during a normal operation mode; and during a DRAM core test operation mode, the I/O pads are used for performing a parallel data transmission. The multi-port memory device provides various DRAM core test operation modes, such as a single data rate (SDR) mode, a double data rate (DDR) mode, and a quadruple data rate (QDR) mode.

In accordance with an aspect of the present invention, there is provided a multi-port memory device including ports, banks, a global data bus, an input output (I/O) controller, mode register set (MRS), a clock generator, and a test I/O controller. The I/O controller transmits a test signal to the global data bus in response to a mode register enable signal. The MRS generates a test enable signal in response to the mode register enable signal and outputs a mode selection signal which determines a data transmission mode of a test I/O signal in response to the test signal. The clock generator receives an external clock and generates an internal clock based on the external clock in response to the mode selection signal. The test I/O controller inputs/outputs the test I/O signal in synchronism with the internal clock. The mode register enable signal active during a test operation mode for testing a core area of the banks.

BRIEF DESCRIPTION OF THE DRAWINGS

FIG. 10 shows the signal combination of a bank information signal and a test signal input to a mode register set shown in FIG. 9.

DESCRIPTION OF SPECIFIC EMBODIMENTS

The present invention provides a multi-port memory device performing a dynamic random access memory (DRAM) core test operation without passing through ports. The multi-port memory device uses input/output (I/O) pads for performing a serial data transmission during a normal operation mode; and during a DRAM core test operation mode, the I/O pads are used for performing a parallel data transmission. The multi-port memory device provides various DRAM core test operation modes, such as a single data rate (SDR) mode, a double data rate (DDR) mode, and a quadruple data rate (QDR) mode.

Figure 9:
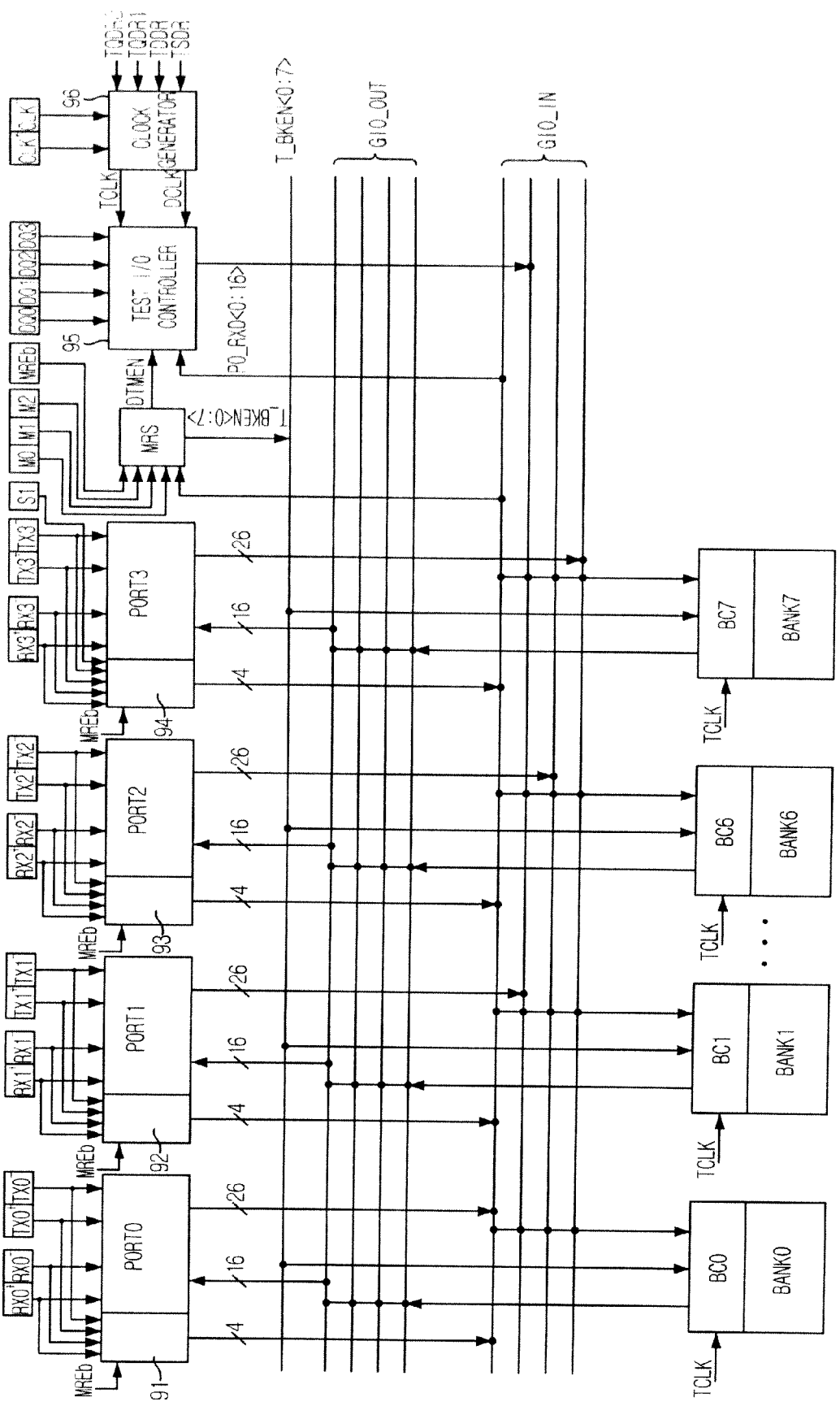
FIG. 9 is a block diagram of a multi-port memory device in accordance with an embodiment of the present invention.

FIG. 9 is a block diagram of the multi-port memory device in accordance with an embodiment of the present invention.

For convenience of explanation, the multi-port memory device having four ports and eight banks is illustrated. Particularly, it is assumed that the multi-port memory device has a 16-bit data frame and performs a 64-bit prefetch operation.

The multi-port memory device includes first to fourth ports PORT0 to PORT3, eight banks BANK0 to BANK7, first and second global data buses GIO_OUT<0:3> and GIO_IN<0:3>, four I/O controllers 91 to 94, a mode register set MRS, test I/O controller 95, and a clock generator 96.

The mode register set MRS determines whether the multi-port memory device performs the normal operation or performs the DRAM core test operation in response to a mode register enable signal MREB. The mode register set MRS generates a bank selection signal T_BKEN<0:7> based on a bank information signal M<0:2>. Herein, the number of bits of the banks selection signal T_BKEN<0:7> corresponds to the number banks BANK0 to BANK7. The mode register set MRS generates the mode selection signals TQDR0, TQDR1, TDDR, and TSDR. Through the mode selection signals TQDR0, TQDR1, TDDR, and TSDR, the mode register set MRS selects a DRAM core test operation mode output of the SDR mode, the DDR mode, and the QDR mode based on a test signal P0_RXD<0:16>. The DRAM core test operation mode determines a data transmission method of a test I/O signal input/output through test pads DQ0 to DQ3. The detailed explanation about the DRAM core test operation mode will be described below. Further, the mode register set MRS generates a test enable signal DTMEN based on the test signal P0_RXD<0:16> input from the second global data bus GIO_IN<0>. Besides, the mode register set MRS generates various mode selection signals such as extended mode register set (EMRS) signal. The EMRS signal is used only for the normal operation mode.

As shown in FIG. 9, single I/O controller is allocated for each of the ports PORT0 to PORT3. In this case, the ports PORT0 to PORt3 are designed to block a data transmission between external devices and the global data buses GIO_OUT<0:3> and GIO_IN<0:3>. The I/O controllers 91 to 94 transmit the test signal P0_RXD<0:16> from the ports PORT0 to PORT3 to the second global data bus GIO_IN<0> when the multi-port memory device performs the DRAM core test operation. The test signal P0_RXD<0:16> is input to the ports PORT0 to PORT3 through I/O pads RXi+, RXi−, TXi+, and TXi− and a dummy pad S1. Herein, "i" corresponds to the number of ports PORT0 to PORT3. In detail, the first I/O controller 91 transmits the test signal P0_RXD<0:3> from the I/O pads RX0+, RX0−, TX0+, and TX0− to the second global data bus GIO<0>. The second I/O controller 92 transmits P0_RXD<4:7> from the I/O pads RX1+, RX1−, TX1+, and TX1− to the second global data bus GIO<0>. The third I/O controller 93 transmits P0_RXD<8:11> from the I/O pads RX2+, RX2−, TX2+, and TX2− to the second global data bus GIO<0>. Finally, the fourth I/O controller 94 transmits P0_RXD<12:16> from the I/O pads RX3+, RX3−, TX3+, and TX− and the dummy pad S1 to the second global data bus GIO<0>. Each of the I/O controllers 91 to 94 includes an input driver for receiving the test signal P0_RXD<0:16> and an output driver for outputting the test signal P0_RXD<0:16> to the second global data bus GIO_IN<0>.

The test I/O controller 95 receives the test signal P0_RXD<0:16> input from the second global data bus GIO_IN<0> and decodes the test signal P0_RXD<0:16> to thereby generate internal commands, e.g., an internal read command READ and an internal write command WRITE. The test I/O controller 95 transmits the test I/O signal input through the test pads DQ0 to DQ3 to the second global data bus GIO_IN in response to the internal write command WRITE; and transmits the data input from the first global data bus GIO_OUT to the test pads DQ0 to DQ3 in response to the internal read command READ.

FIG. 10 shows the signal combination of the bank information signal M<0:2> and the test signal P0_RXD<0:15> input to the mode register set MRS shown in FIG. 9. The test signal P0_RXD<16> input through the dummy pad S1 is not explained.

The mode register set MRS decodes the bank information signal M<0:2> and generates the bank selection signal T_BKEN<0:7>. The banks selection signal T_BKEN<0:7> is input to the bank controllers BC0 to BC7 and used for selecting the bank receiving the test signal P0_RXD<0:16> and the test I/O signal. The test signal P0_RXD<0> is used for generating the test enable signal DTMEN. For example, when the P0_RXD<0> is a logic high level, the test enable signal DTMEN is enabled. The test signals P0_RXD<5:6> decides the DRAM core test operation mode. The mode register set MRS decodes the test signal P0_RXD<5:6> and generates the mode selection signals TQDR0, TQDR1, TDDR, and TSDR. The other bits of the test signal P0_RXD<0:16> includes information about command and address for banks. The bank controllers BC0 to BC7 decodes the other bits of the test signal P0_RXD<0:16> and generates commands and address signals.

Hereinafter a test read operation and a test write operation of the multi-port memory device shown in FIG. 9 is described.

First, for the test write operation, the mode register enable signal MREB holds a logic low level. The test signal P0_RXD<0:16> input through the I/O pads RXi+, RXi−, TXi+, and TXi− and the dummy pad S1 is output to the second global data bus GIO_IN<0> in response to the mode register enable signal MREB of the logic low level. The mode register set MRS receives the test signal P0_RXD<0:16> from the second global data bus GIO_IN<0>. The mode register set MRS enables the test enable signal DTMEN based on the test signal P0_RXD<0>. The mode register further generates the bank selection signal T_BKEN<0:7> based on the bank information signal M<0:2>. The bank selection signal T_BKEN<0:7> is transmitted to the bank controllers BC0 to BC7. The multi-port memory device includes an additional data bus for transmitting the bank selection signal T_BKEN<0:7>. The test I/O controller 95 receives the test signal P0_RXD<0:16> from the second global data bus GIO_IN<0> in response to the test enable signal DTMEN. The test I/O controller 95 generates the internal write command WRITE by decoding the test signal P0_RXD<0:16>. Then, the test I/O controller 95 transmits the test signal P0_RXD and the test I/O signal input through the test pads DQ0 to DQ3 to the second global data bus GIO_IN in response to the internal write command WRITE. The bank controllers BC0 to BC7 determine a destination of the test I/O signal in response to the bank selection signal T_BKEN<0:7>. For example, when the first bit T_BKEN<0> of the bank selection signal T_BKEN<0:7> is activated, the first bank controller BC0 is activated and transmits the test I/O signal to the first bank BANK0. Herein, the first bank controller BC0 generates a write command and address signals by decoding the test signal P0_RXD<0:16> and transmits the write command and the address signals to the first bank BANK0. The first bank BANK0 writes the test I/O signal in response to the write command and the address signals.

Next, for the test read operation, the mode register enable signal MREB holds the logic low level. The test signal P0_RXD<0:16> input through the I/O pads RXi+, RXi−, TXi+, and TXi− and the dummy pad S1 is output to the second global data bus GIO_IN<0> in response to the mode register enable signal MREB of the logic low level. The test I/O controller 95 receives the test signal P0_RXD<0:16> from the second global data bus GIO_IN<0> in response to the test enable signal DTMEN. The test I/O controller 95 generates the internal read command READ by decoding the test signal P0_RXD<0:16>. Herein, the test I/O controller 95 does not receive any signal through the test pads DQ0 to DQ3. The bank controllers BC0 to BC7 determine a destination of the test I/O signal in response to the bank selection signal T_BKEN<0:7>. For example, when the first bit T_BKEN<0> of the bank selection signal T_BKEN<0:7> is activated, the first bank controller BC0 is activated and generates a read command and address signals by decoding the test signal P0_RXD<0:16>. Then, the first bank controller BC0 transmits the read command and the address signals to the first bank BANK0. The first bank BANK0 reads data according to the address signals in response to the read command and outputs the data to the first global data bus GIO_OUT. The test I/O controller 95 receives the data from the first global data bus GIO_OUT and outputs the data to the test pads DQ0 to DQ3 in response to the internal read command READ.

As mentioned above, the multi-port memory device provides the various DRAM core test operation modes, such as the SDR mode, the DDR mode, the first QDR mode QDR0, and the second QDR mode QDR1. The mode register set MRS generates the mode selection signals TSDR, TDDR, TQDR0, and TQDR1 for respectively accomplishing the DRAM core test operation modes, i.e., the SDR mode, the DDR mode, the first QDR mode QDR0, and the second QDR mode QDR1. The clock generator 96 shown in FIG. 9 generates internal clocks TCLK and DCLK based on the mode selection signals TSDR, TDDR, TQDR0, and TQDR1.

Figure 11:
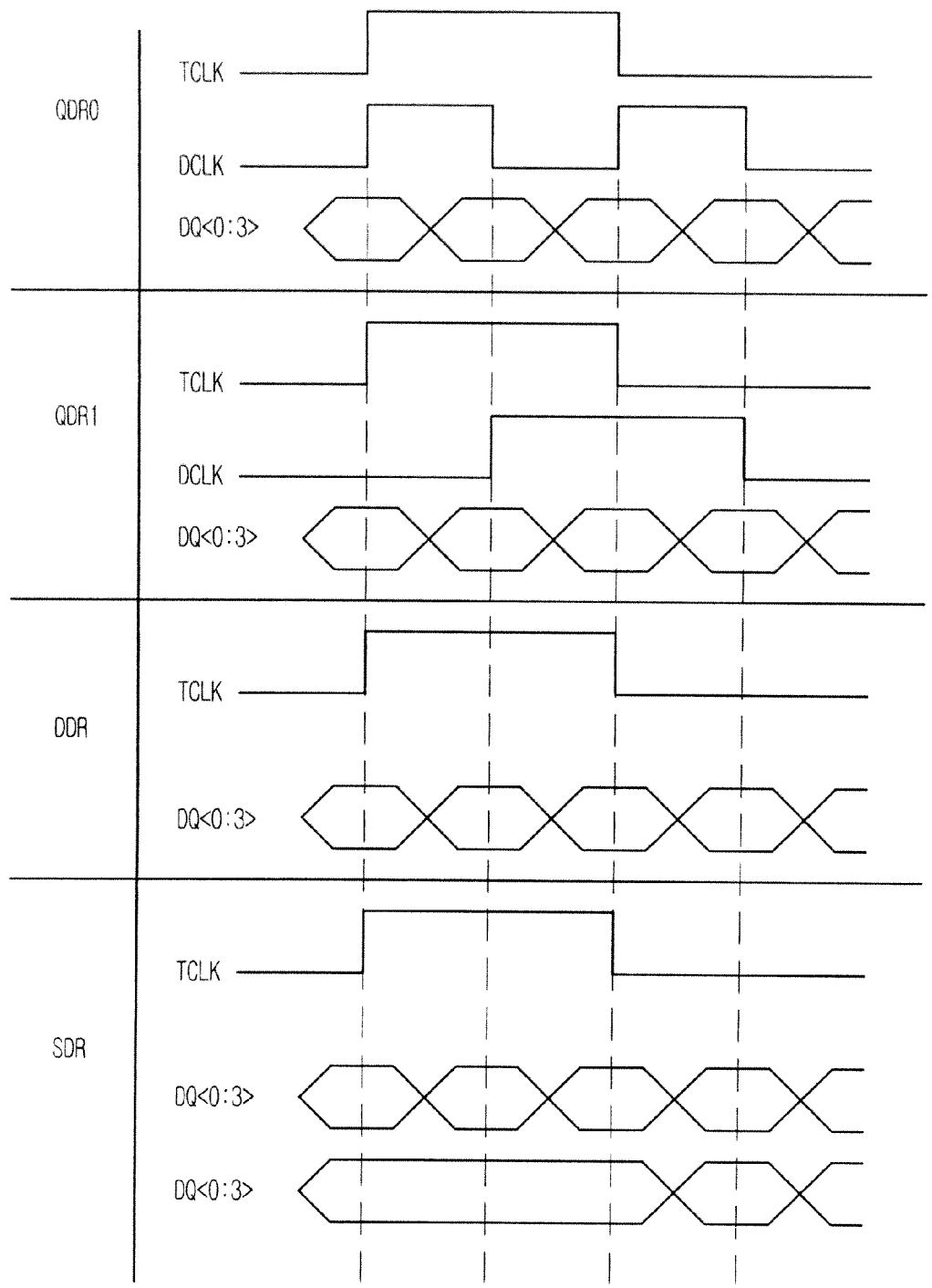
FIG. 11 is a timing diagram illustrating internal clocks generated by a clock generator shown in FIG. 9.

FIG. 11 is a timing diagram illustrating the internal clocks generated by the clock generator 96 shown in FIG. 9.

The clock generator 96 receives first and second external clocks CLK+ and CLK− and generates the internal clocks TCLK and DCLK in response to the mode selection signals TSDR, TDDR, TQDR0, and TQDR1.

In case that the multi-port memory device performs the first QDR mode QDR0, the second internal clock DCLK is twice the frequency of the first internal clock TCLK. That is, the second internal clock DCLK transits from a logic low level to a logic high level twice, once at a rising edge and, then, at a falling edge of the first internal clock TCLK. During the first QDR mode QDR0, the multi-port memory device writes the test I/O signals input through the test pads DQ0 to DQ3 at every rising edges and falling edges of the second internal clock DCLK. Herein, the first internal clock TCLK is used for a command strobe clock, i.e., a reference clock for commands and addresses.

For the second QDR mode QDR1, the clock generator 96 generates the first and the second internal clocks TCLK and DCLK having the same period but different phase. In detail, the phase of the second internal clock DCLK lags behind that of the first internal clock TCLK as much as 90°. Accordingly, the multi-port device writes the test I/O signals at every rising edge and falling edge of the first and the second internal clocks TCLK and DCLK. The first internal clock TCLK is used for the command strobe clock.

For the DDR mode and the SDR mode, the second internal clock DCLK holds a logic high level or a logic low level. In another embodiment, the second clock DCLK has the same pulse as the first internal clock TCLK. When a logic block activated by the second internal clock DCLK is enabled by a signal of logic high level, the second internal clock DCLK holds the logic low level. Further, when the logic block activated by the second internal clock DCLK is enabled by a signal logic low level, the second internal clock DCLK holds the logic high level. That is, in case that the second internal clock DCLK holds the logic low level or the logic high level, the second internal clock DCLK has a constant level so that it does not affect data transmission. In this case, the second internal clock DCLK is not used for a data strobe signal. In case that the second internal clock DCLK has the same pulse as the first internal clock TCLK, the second internal clock DCLK can be used as the data strobe clock. During the DDR mode and the SDR mode, the multi-port memory device receives the test I/O data at the rising edge and the falling edge of the first internal clock TCLK. Thus, the first internal clock TCLK is used for the data strobe clock as well as the command strobe clock.

Figure 12:
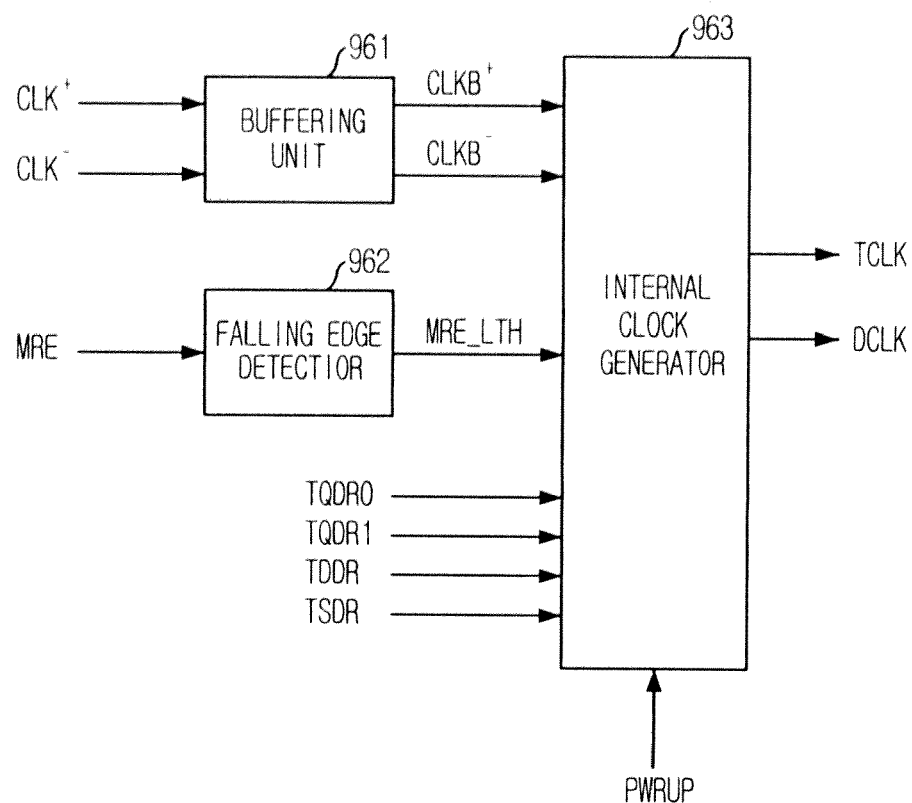
FIG. 12 is a block diagram of the clock generator shown in FIG. 9.

FIG. 12 is a block diagram of the clock generator 96 shown in FIG. 9.

The clock generator 96 includes a buffering unit 961, a falling edge detector 962, and internal clock generator 963. The buffering unit 961 buffers the external clocks CLK+ and CLK−. The falling edge detector 962 detects a falling edge of an inverted mode register enable signal MRE. The inverted mode register MRE is a complementary signal of the mode register enable signal MREB. The inverted mode register enable signal MRE has a logic low level during the normal operation mode. The internal clock generator 963 generates the internal clocks TCLK and DCLK based on the external clocks CLK+ and CLK+ in response to the mode selection signals TQDR0, TQDR1, DDR, and TSDR.

Figure 13:
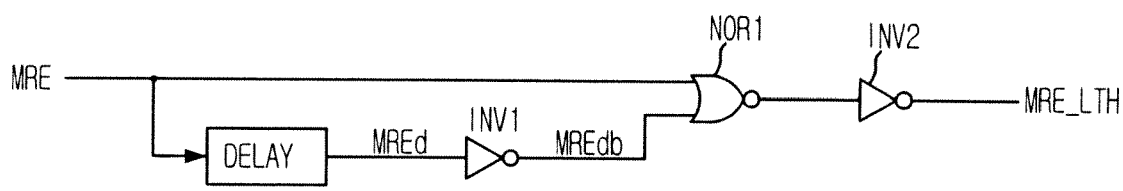
FIG. 13 is a schematic circuit diagram of a falling edge detector shown in FIG. 12.

FIG. 13 is a schematic circuit diagram of the falling edge detector 962 shown in FIG. 12.

The falling edge detector 962 includes a delay DELAY, two inverters INV1 and INV2, and a first NOR gate NOR1. The delay DELAY delays the inverted mode register enable signal MRE. The first inverter INV1 inverts an output MRED of the delay DELAY. The first NOR gate NOR1 logically combines the inverted mode register enable signal MRE and an output MREDB of the first inverter INV1. The second inverter INV2 inverts an output of the first NOR gate NOR1 to thereby output the falling edge detection signal MRE_LTH. The falling edge detector 962 receives the inverted mode register enable signal MRE and detects the falling edge of the inverted mode register enable signal MRE. The falling edge detector 962 outputs the detection signal MRE_LTH having a low pulse of a predetermined pulse width determined by the delay DELAY. The falling edge detection signal MRE_LTH is used for escaping from the DRAM core test operation mode.

Figure 14:
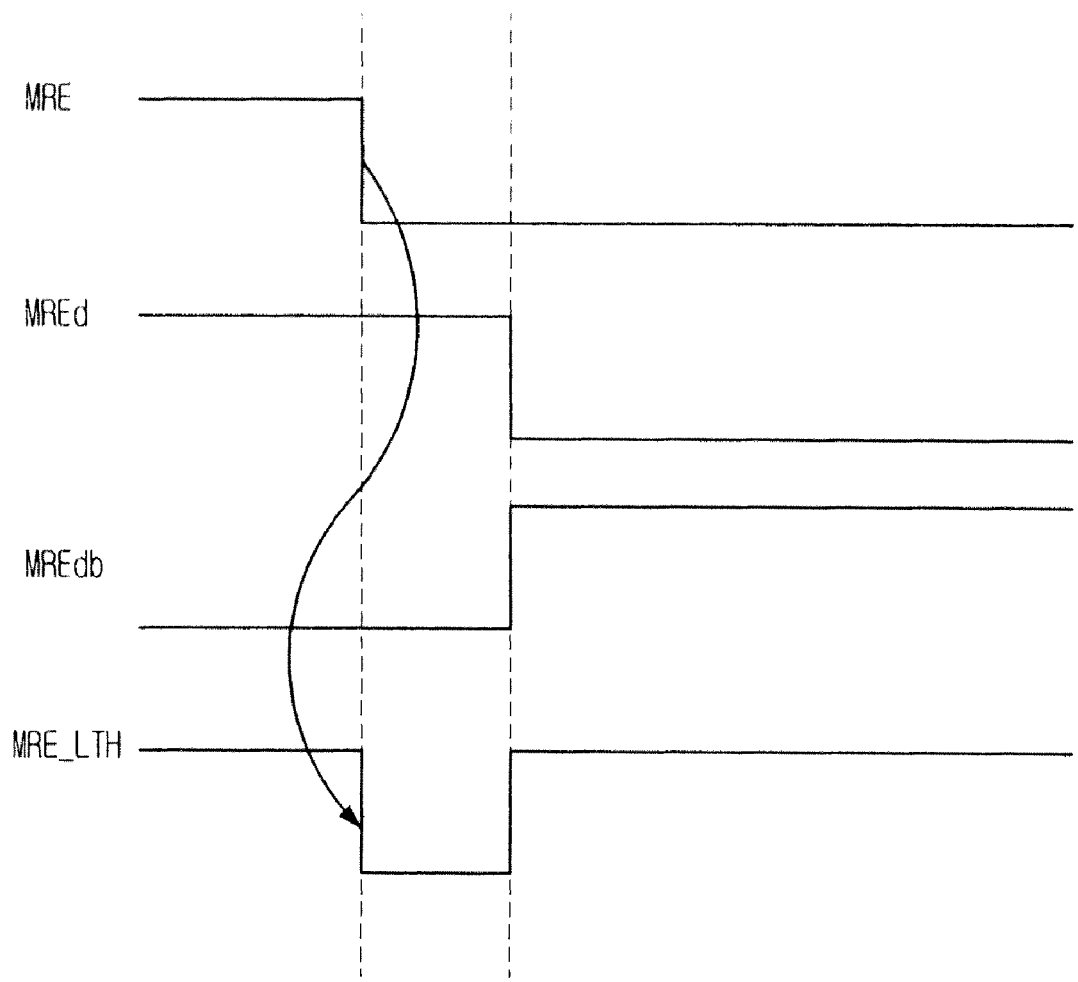
FIG. 14 is a waveform illustrating an operation of the falling edge detector shown in FIG. 13.

FIG. 14 is a waveform illustrating an operation of the falling edge detector 962 shown in FIG. 13.

As shown, the falling edge detector 962 generates the falling edge detection signal MRE_LTH in synchronism with the falling edge of the inverted mode register enable signal MRE. The falling edge detection signal MRE_LTH has the pulse width determined by the delay DELAY.

Figure 15:
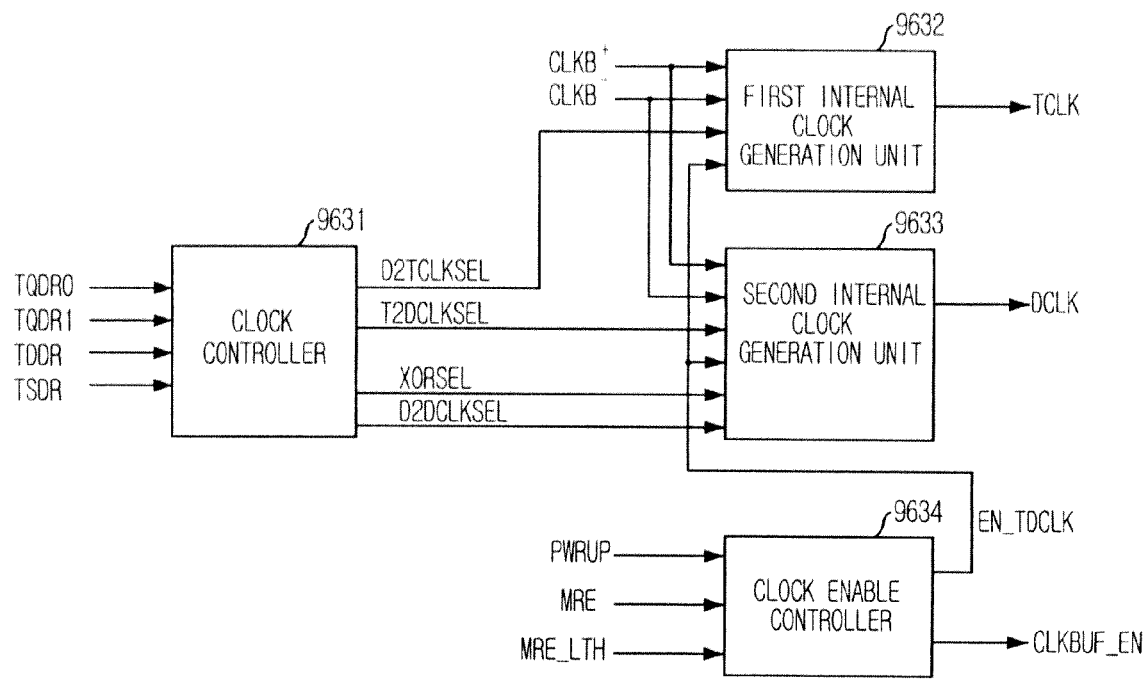
FIG. 15 is a block diagram of an internal clock generator shown in FIG. 12.

FIG. 15 is a block diagram of the internal clock generator 963 shown in FIG. 12.

The internal clock generator 963 includes a clock controller 9631, a first internal clock generation unit 9632, a second internal clock generation unit 9633, and a clock enable controller 9634. The clock controller 9631 decodes the mode selection signal TQDR0, TQDR1, TDDR, and TSDR and generates first to fourth control signals T2DCLKSEL, XORSEL, D2DCLKSEL, and D2TCLKSEL. The fourth control signal D2TCLKSEL is used for selecting the first internal clock TCLK. The first to the third control signals T2DCLKSEL, XORSEL, D2DCLKSEL are used for selecting the second internal clock DCLK. The first internal clock generation unit 9632 generates the first internal clock TCLK in response to an internal clock enable signal EN_TDCLK output from the clock enable controller 9634. The second internal clock generation unit 9633 generates the second internal clock DCLK in response to the internal clock enable signal EN_TDCLK and the first and the third control signals T2DCLKSEL, XORSEL, and D2DCLKSEL. The clock enable controller 9634 generates the internal clock enable signal EN_TDCLK in response to the power-up signal PWRUP, the inverted mode register enable signal MRE, and the falling edge detection signal MRE_LTH.

The internal clock generator 963 generates the first and the second internal clocks TCLK and DCLK in response to the mode selection signals TQDR0, TQDR1, TDDR, and TSDR. For example, when the falling edge detection signal MRE_LTH is the logic low level, the internal clock generator 963 outputs the first and the second internal clocks TCLK and DCLK of the logic low level or the logic high level, especially, the logic high level in this embodiment. Because the multi-port memory device performs the normal operation when the falling edge detection signal MRE_LTH is the logic low level, the first and the second internal clocks TCLK and the DCLK have the logic high level without concerning the mode selection signals TQDR0, TQDR1, TDDR, and TSDR. On the contrary, when the falling edge detection signal MRE_LTH has the logic high level, the first and the second internal clocks TCLK and DCLK are output based on the buffered external clocks CLKB+ and CLKB−.

Figure 16:
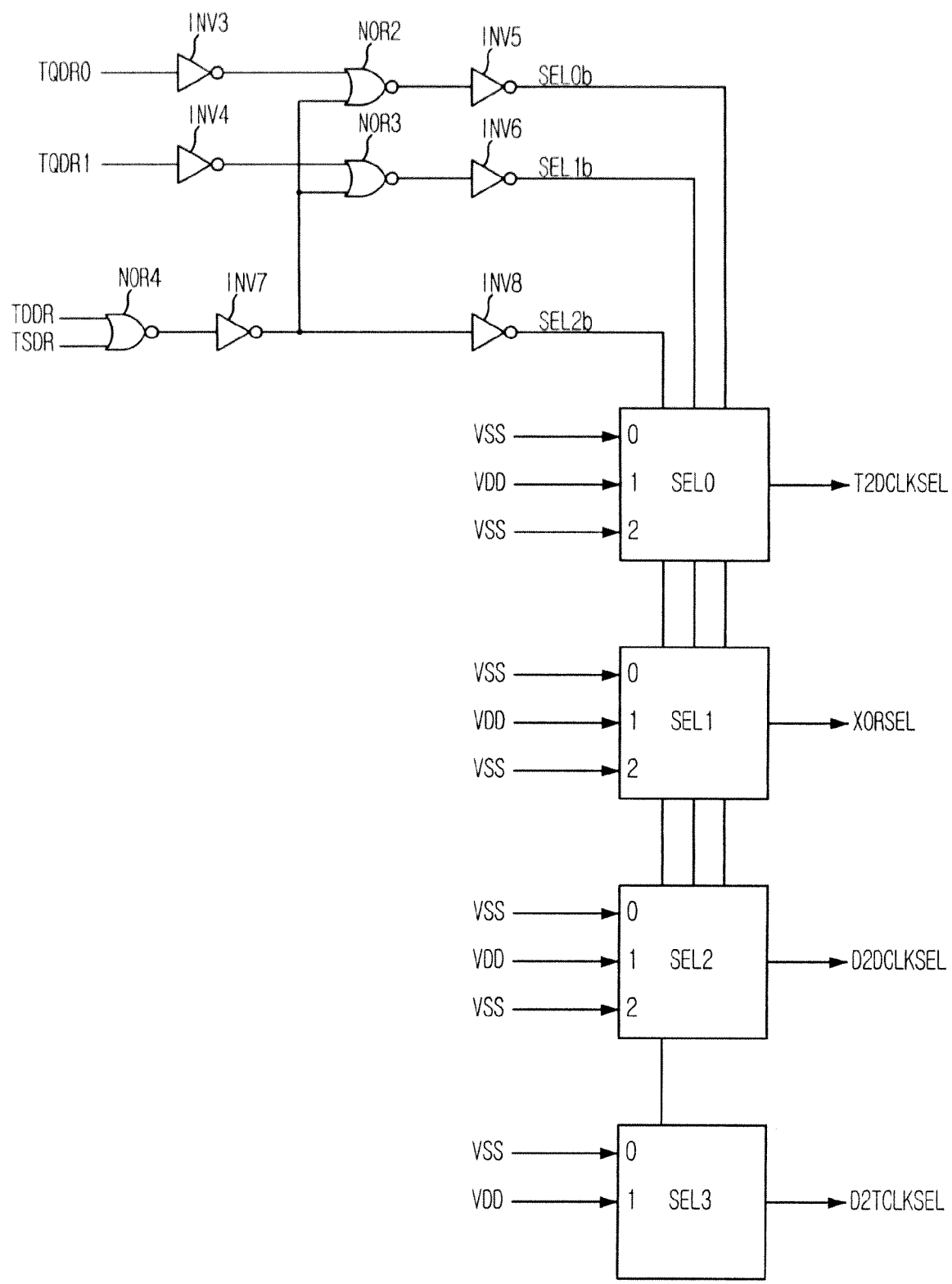
FIG. 16 is a detailed diagram of a clock controller shown in FIG. 15.

FIG. 16 is a detailed diagram of the clock controller 9631 shown in FIG. 15.

The clock controller 9631 includes six inverters INV3 to INV8, four NOR gates NOR2 to NOR5, and four selection units SEL0 to SEL3. The clock controller 9631 decodes the mode selection signals TQDR0, TQDR1, TDDR, and TSDR through the six inverters INV3 to INV8 and the four NOR gates NOR2 to NOR5 and generates first to third selection signals SEL0B to SEL2B. In case that, the first selection signal SEL0B is activated as a logic low level, the DRAM core test operation mode is decided as the first QDR mode QDR0. In case that the second selection signal SEL1B is activated as a logic low level, the second QDR mode QDR1 is selected as the DRAM core test operation mode. Finally, in case that the third selection signal SEL2B is activated as a logic low level, the SDR mode or the DDR is selected as the DRAM core test operation mode.

Figure 17:
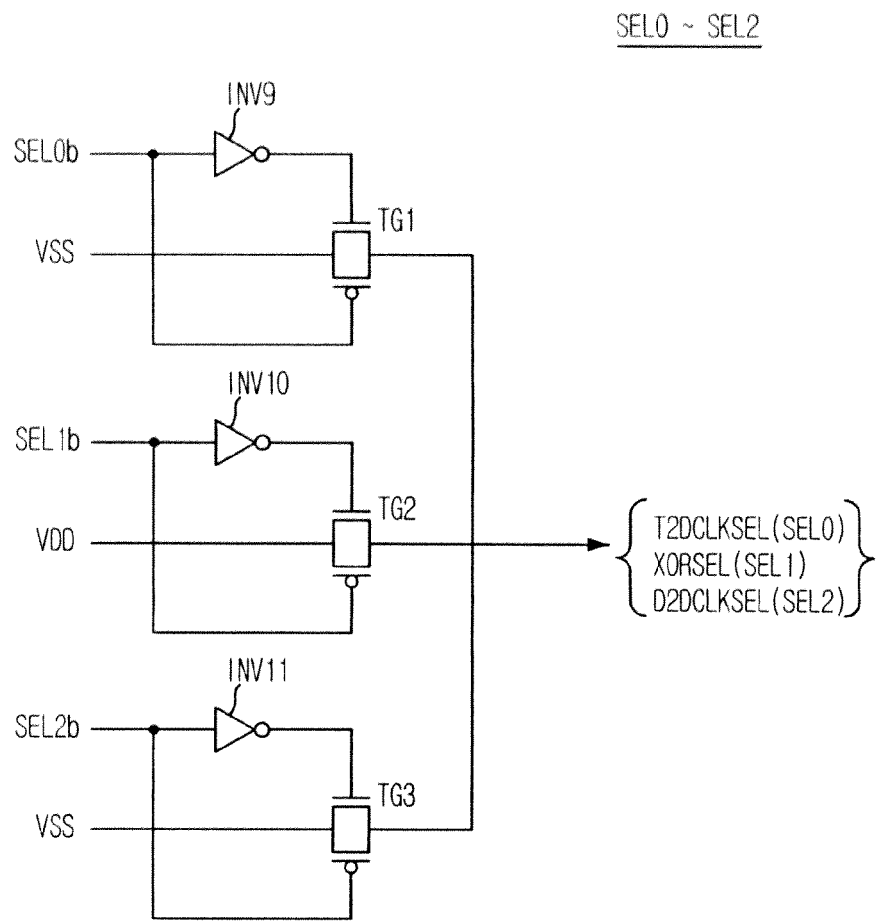
FIG. 17 is a schematic circuit diagram of a first selection unit shown in FIG. 16.

FIG. 17 is a schematic circuit diagram of the first selection unit SEL0 shown in FIG. 16.

The first selection unit SEL0 is provided with three transmission gates TG1 to TG3. The first transmission gate TG0 transmits a ground voltage VSS in response to the first selection signal SEL0B. The second transmission gate TG2 transmits a power supply voltage VDD in response to the second selection signal SEL1B. The third transmission gate TG3 transmits the ground voltage VSS in response to the third selection signal SEL2B. The first selection unit SEL0 selects one of outputs of the first to third transmission gates TG1 to TG3 and outputs the selected one as the first control signal T2DCLKSEL. The second selection unit SEL1 has the similar structure as that of the first selection unit SEL0 shown in FIG. 17 and outputs the second control signal. The third selection unit SEL2 has the similar structure with the first selection unit SEL0 except that three transmission gates included in the third selection unit SEL2 transmit the power supply voltage VDD in response to the first to third selection signals SEL0B, SEL1B, and SEL2B and outputs the third control signal D2DCLKSEL.

Figure 18:
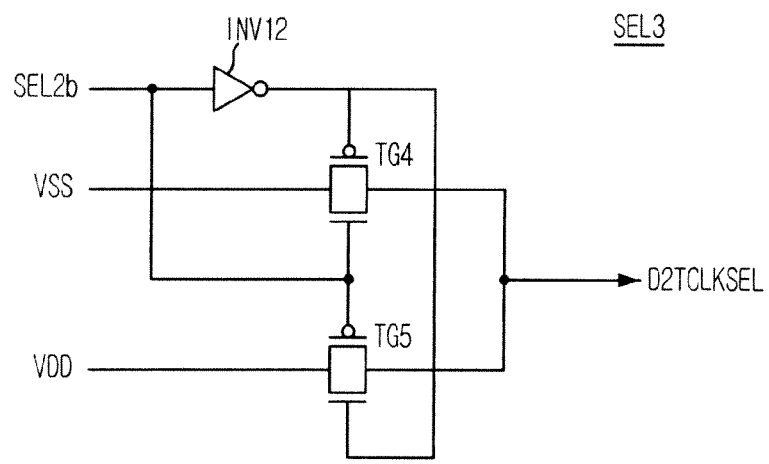
FIG. 18 is a schematic circuit diagram of a fourth selection unit shown in FIG. 16.

FIG. 18 is a schematic circuit diagram of the fourth selection unit SEL3 shown in FIG. 16.

The fourth selection unit SEL3 includes two transmission gates TG4 and TG5. The fourth transmission gate TG4 transmits the ground voltage VSS in response to the third selection signal SEL2B. The fifth transmission gate TG5 transmits the power supply voltage VDD in response to an inverted signal of the third selection signal SEL2B. Therefore, the fourth selection unit SEL3 outputs one of the ground voltage VSS and the power supply voltage VDD as the fourth control signal D2TCLKSEL in response to the third selection signal SEL2B.

For the first QDR mode QDR0, the mode selection signal TQDR0 becomes the logic high level; and the other mode selection signals TQDR1, TDDR, and TSDR become the logic low level. Accordingly, the first selection signal SEL0B becomes the logic low level; and the other selection signals SEL1B and SEL2B become the logic high level. In response to the selection signals SEL0B to SEL2, the selection units SEL0, SEL1, and SEL3 output the control signals T2DCLKSEL, XORSEL, and D2TCLKSEL having a ground voltage VSS level; and the third selection unit SEL2 outputs the control signal D2DCLKSEL.

For the second QDR mode QDR1, the mode selection signal TQDR1 becomes the logic high level; and the other mode selection signals TQDR1, TDDR, and TSDR become the logic low level. Accordingly, the second selection signal SEL1B becomes the logic low level; and the other selection signals SEL0B and SEL2B become the logic high level. In response to the selection signals SEL0B to SEL2B, the first to third selection units SEL0 to SEL2 outputs the controls signals T2DCLKSEL, XORSEL, and D2DCLKSEL having a power supply voltage VDD level; and the fourth selection unit SEL3 outputs the fourth control signal D2TCLKSEL having the ground voltage VSS level.

Next, for the DDR mode or the SDR mode, one of the mode selection signals TDDR and TSDR becomes the logic high level; and the other mode selection signals TQDR0 and TQDR1 becomes the logic low level. Accordingly, the third selection signal SEL2B becomes the logic low level; and the other selection signals SEL0B and SEL1B becomes the logic high level. In response to the selection signals SEL0B to SEL2B, the first and the second selection units SEL0 and SEL1 outputs the first and the second control signals T2DCLKSEL and XORSEL having the ground voltage VSS level; and the third and the fourth selection units SEL2 and SEL3 outputs the third and the fourth control signals having the power supply voltage VDD level.

Figure 19:
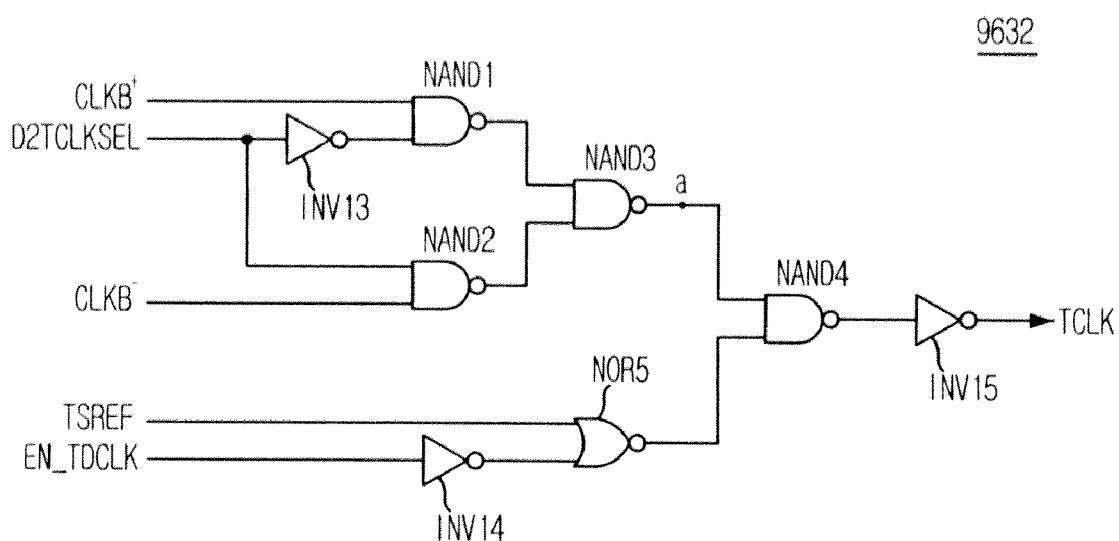
FIG. 19 is a schematic circuit diagram of a first internal clock generation unit shown in FIG. 15.

FIG. 19 is a schematic circuit diagram of the first internal clock generation unit 9632 shown in FIG. 15

The first internal clock generation unit 9632 generates the first internal clock TCLK in response to the internal clock enable signal EN_TDCLK output from the clock enable controller 9634. In detail, the first internal clock generation unit 9632 outputs the first internal clock TCLK having a logic high level without concerning the fourth control signal D2TCLKSEL in case that the internal clock enable signal EN_TDCLK is a logic high level. Meanwhile, when the internal clock enable signal EN_TDCLK is a logic high level and a self refresh signal TSREF is a logic low level, the first internal clock generation unit 9632 outputs the first internal clock TCLK based on the buffered external clock CLKB+. Herein, the self refresh signal TSREF has a logic high level during a self refresh operation. Usually, because a DRAM device does not use clocks during the self refresh operation, the multi-port memory device makes the internal clocks TCLK and DCLK have the logic high level during the self refresh operation.

As shown in FIG. 19, the first internal clock generation unit 9632 includes four NAND gates NAND1 to NAND4, three inverters INV9 to INV11, and a fifth NOR gate NOR5. The ninth inverter INV9 inverts the fourth control signal D2TCLKSEL. The first NAND gate NAND1 logically combines the first buffered external clock CLKB+ and an output of the ninth inverter INV9. the second NAND gate NAND2 logically combines the fourth control signal D2TCLKSEL and the second buffered external clock CLKB−. The third NAND gate NAND3 logically combines outputs of the first and the second NAND gates NAND1 and NAND2. The tenth inverter INV10 inverts the internal clock enable signal EN_TDCLK. The fifth NOR gate NOR5 logically combines the self refresh signal TSREF and an output of the tenth inverter INV10. The fourth NAND gate NAND4 logically combines outputs of the third NAND gate NAND3 and the fifth NOR gate NOR5. The eleventh inverter INV11 inverts an output of the fourth NAND gate NAND4 to thereby generate the first internal clock TCLK.

Figure 20:
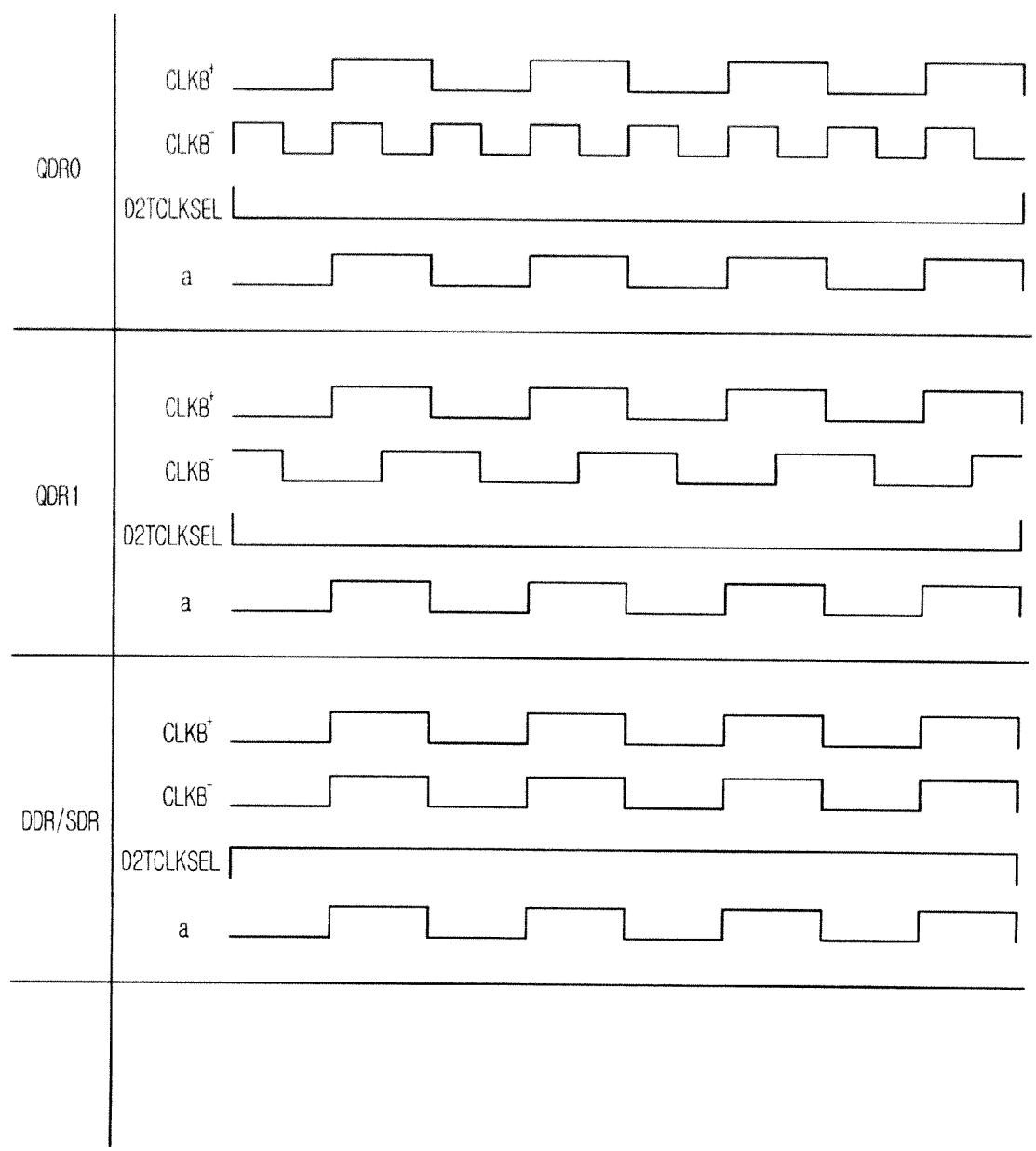
FIG. 20 is a waveform illustrating an operation of the first internal clock generation unit shown in FIG. 19.

FIG. 20 is a waveform illustrating operation of the first internal clock generation unit 9632 shown in FIG. 19.

For the first QDR mode QDR0, the second buffered external clock CLKB− is twice the frequency of the first buffered external clock CLKB+. Further, for the first QDR mode QDR0, the fourth control signal D2TCLKSEL having the ground voltage VSS level is input to the first internal clock generation unit 9632. Therefore, the output of the third NAND gate NAND3 is substantially the same as the first buffered external clock CLKB+. When the self refresh signal TSREF is the logic low level and the internal clock enable signal EN_TDCLK is the logic high level, the first internal clock TCLK is substantially same as the output of the third NAND gate NAND3.

For the second QDR mode QDR1, the first buffered external clock CLKB+ has the same period but different phase with the second buffered external clock CLKB−. In detail, the phase of the second buffered external clock CLKB− lags behind that of the first buffered external clock CLKB+ as much as 90°. Further, for the second QDR mode QDR1, the fourth control signal D2TCLKSEL has the ground voltage VSS level and, therefore, the output of the third NAND gate NAND3 is substantially same as the first buffered external clock CLKB+. When the self refresh signal TSREF is the logic low level and the internal clock enable signal EN_TD-CLK is the logic high level, the first internal clock TCLK is substantially same as the output of the third NAND gate NAND3.

Next, for the DDR mode or the SDR mode, the first and the second buffered external clocks CLKB+ and CLKB− are substantially the same. Further, for the DDR mode and the SDR mode, the fourth control signal D2TCLKSEL having the power supply voltage VDD level. Therefore, the output of the third NAND gate NAND3 is substantially same as the second buffered external clock CLK− and, thus, same as the first buffered external clock CLK+. When the self refresh signal TSREF is the logic low level and the internal clock enable signal EN_TDCLK is the logic high level, the first internal clock TCLK is substantially same as the output of the third NAND gate NAND3.

Figure 21:
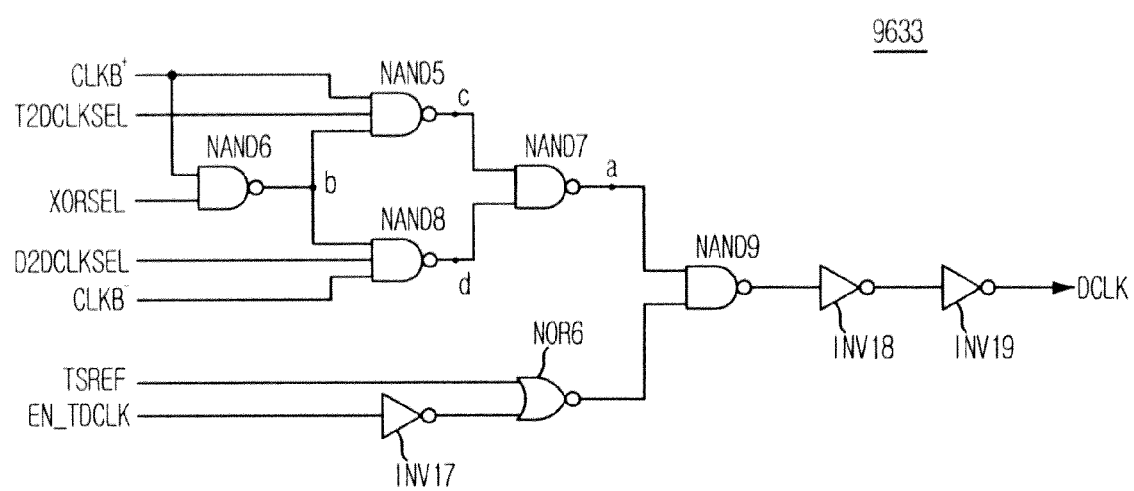
FIG. 21 is a schematic circuit diagram of a second internal clock generation unit 9633 shown in FIG. 15.

FIG. 21 is a schematic circuit diagram of the second internal clock generation unit 9633 shown in FIG. 15.

The second internal clock generation unit 9633 generates the second internal clock DCLK in response to the internal clock enable signal EN_TDCLK and the first and the third control signals T2DCLKSEL, XORSEL, and D2DCLKSEL. In detail, the second internal clock generation unit 9633 outputs the second internal clock DCLK having the logic high level without concerning the first to the third control signal T2DCLKSEL, XORSEL, and D2DCLKSEL in case that the self refresh signal TSREF is the logic high level or the internal clock enable signal EN_TDCLK is the logic low level. Further, in case that the self refresh signal TSREF is the logic low level and the internal clock enable signal EN_TDCLK is the logic high level, the second internal clock generation unit 9633 generates the second internal clock DCLK based on the second buffered external clock CLKB−.

As shown in FIG. 21, the second internal clock generation unit 9633 includes five NAND gates NAND5 to NAND9, three inverters INV12 to INV14, and a sixth NOR gate NOR6. the sixth NAND gate NAND6 logically combines the first buffered external clock CLKB+ and the second control signal XORSEL. The fifth NAND gate NAND5 logically combines the first buffered external clock CLKB+, the first control signal T2DCLKSEL, and an output of the sixth NAND gate NAND6. the eighth NAND gate NAND8 logically combines the output of the sixth NAND gate NAND6, the third control signal D2DCLKSEL, and the second buffered external clock CLK−. The seventh NAND gate NAND7 logically combines outputs of the fifth and the eighth NAND gates NAND5 and NAND8. The twelfth inverter INV12 inverts the internal clock enable signal EN_TDCLK. The sixth NOR gate NOR6 logically combines the self refresh signal TSREF and an output of the twelfth inverter INV12. The ninth NAND gate NAND9 logically combines outputs of the seventh NAND gate NAND7 and the sixth NOR gate NOR6. The thirteenth inverter INV13 inverts an output of the ninth NAND gate NAND9. The fourteenth inverter INV14 inverts an output of the thirteenth inverter INV13 to thereby output the second internal clock DCLK.

Figure 22:
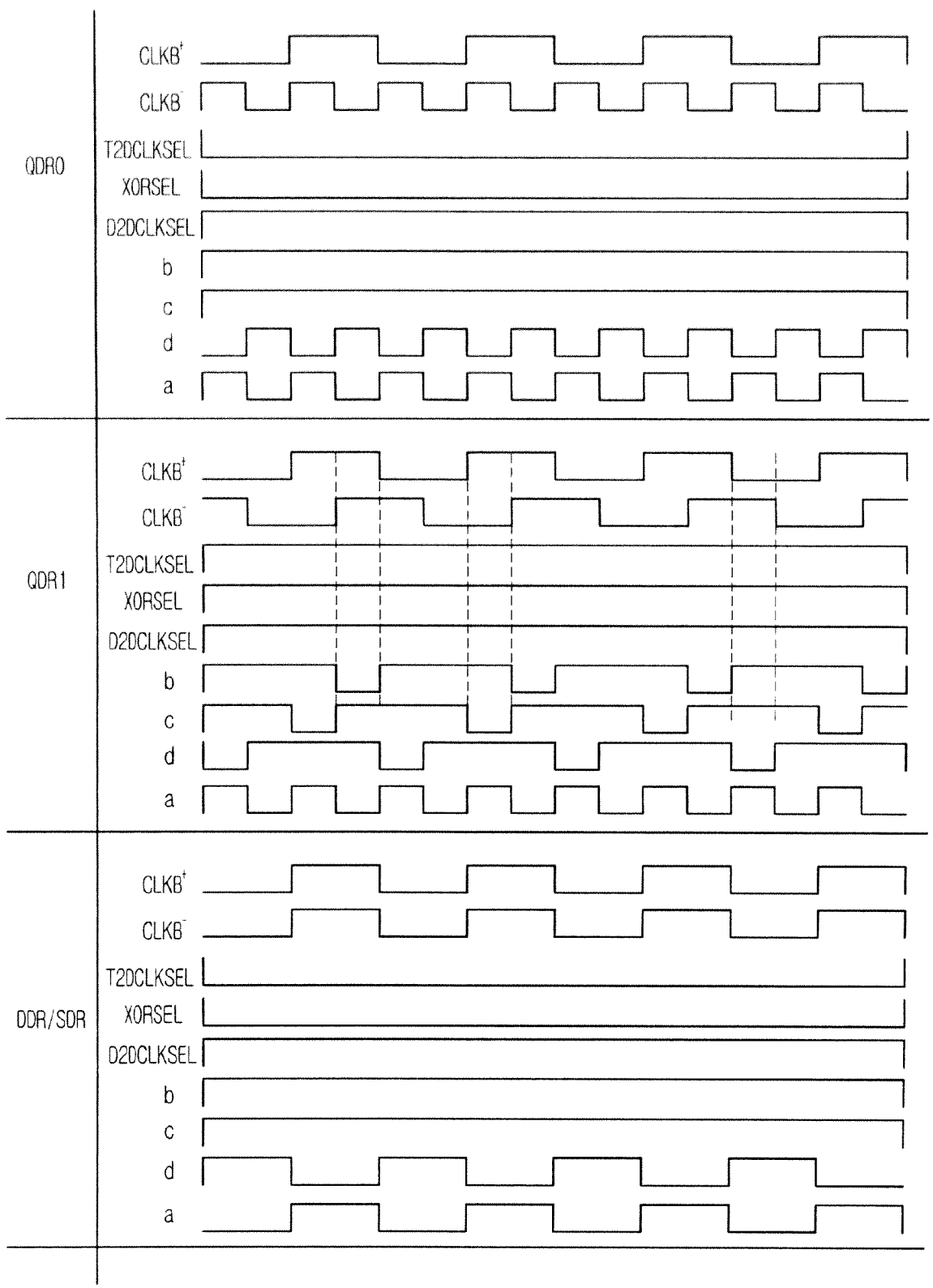
FIG. 22 is a waveform illustrating an operation of the second internal clock generation unit 9633 shown in FIG. 21.

FIG. 22 is a waveform illustrating an operation of the second internal clock generation unit 9633 shown in FIG. 21.

For the first QDR mode QDR0, the second buffered external clock CLKB− is twice the frequency of the first buffered external clock CLKB+. Further, for the first QDR mode QDR0, the first and the second control signals T2DCLKSEL and XORSEL have the ground voltage VSS level; and third control signal D2DCLKSEL has the power supply voltage VDD level. Therefore, the output of the seventh NAND gate NAND7 is substantially the same as the second buffered external clock CLKB−. When the self refresh signal TSREF is the logic low level and the internal clock enable signal EN_TDCLK is the logic high level, the first internal clock TCLK is substantially same as the output of the seventh NAND gate NAND7.

For the second QDR mode QDR1, the first buffered external clock CLKB+ has the same period but different phase with the second buffered external clock CLKB−. In detail, the phase of the second buffered external clock CLKB− lags behind that of the first buffered external clock CLKB+ as much as 90°. Further, for the second QDR mode QDR1, the first to third control signals T2DCLKSEL, XORSEL, and D2DCLKSEL have the power supply voltage level. Therefore, the output of the seventh NAND gate NAND7 is twice the frequency of the second buffered external flock CLKB−. When the self refresh signal TSREF is the logic low level and the internal clock enable signal EN_TDCLK is the logic high level, the first internal clock TCLK is substantially same as the output of the seventh NAND gate NAND7.

Next, for the DDR mode or the SDR mode, the first and the second buffered external clocks CLKB+ and CLKB− are substantially the same. Further, for the DDR mode and the SDR mode, the first and the second control signals T2DCLKSEL and XORSEL have the ground voltage VSS level; and the third control signal D2DCLKSEL has the power supply voltage VDD level. Therefore, the output of the seventh NAND gate NAND3 is substantially same as the second buffered external clock CLK−. When the self refresh signal TSREF is the logic low level and the internal clock enable signal EN_TDCLK is the logic high level, the first internal clock TCLK is substantially same as the output of the seventh NAND gate NAND7.

Figure 23:
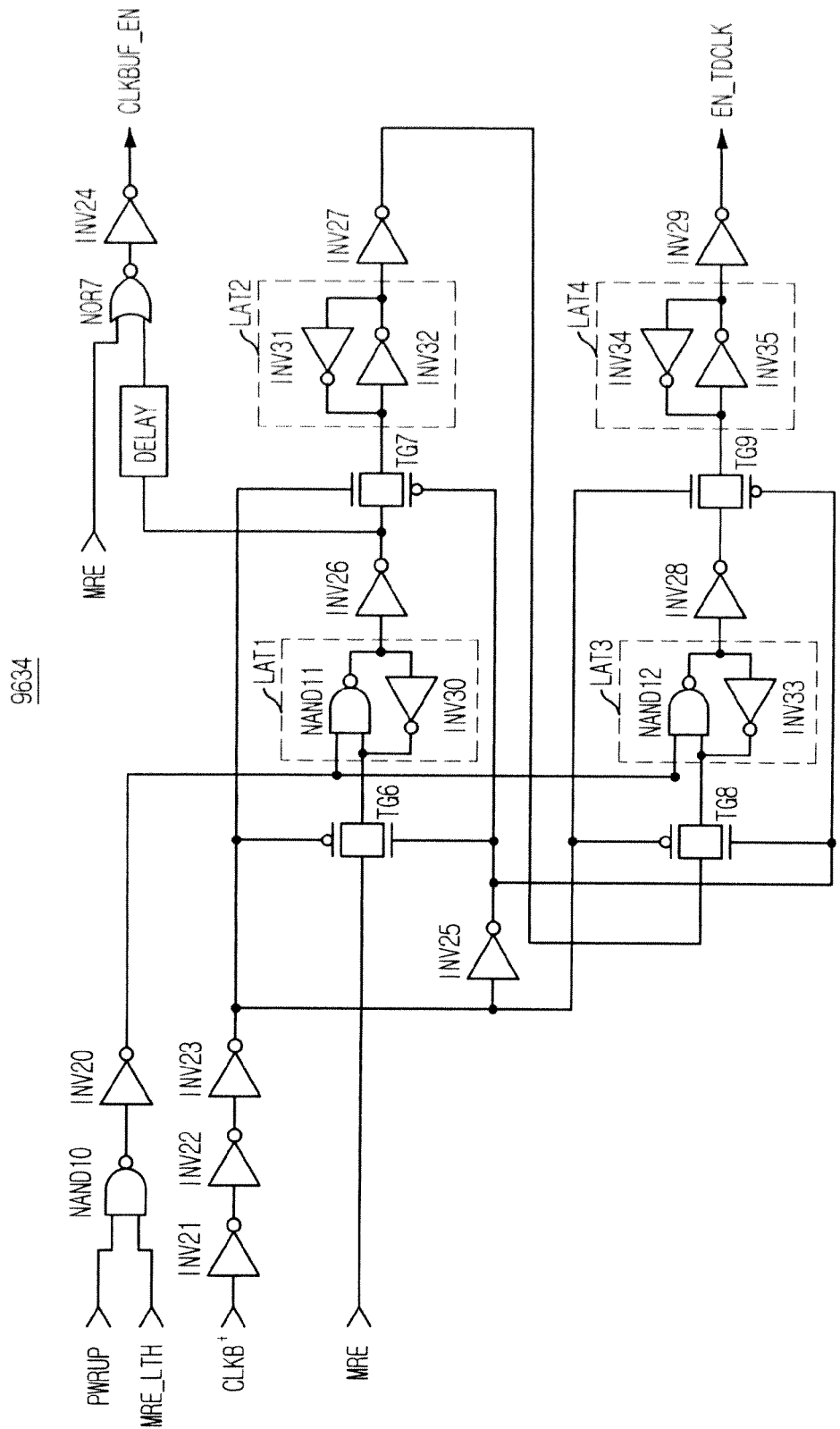
FIG. 23 is schematic circuit diagram of a clock enable controller shown in FIG. 15.

FIG. 23 is a schematic circuit diagram of the clock enable controller 9634 shown in FIG. 15.

The clock enable controller 9634 generates the internal clock enable signal EN_TDCLK in response to the power-up signal PWRUP, the inverted mode register enable signal MRE, and the falling edge detect ion signal MRE_LTH. The internal clock enable signal EN_TDCLK controls the first and the second internal clocks TCLK and DCLK respectively output from the first and the second internal clock generation units 9632 and 9633. In detail, the clock enable controller 9634 outputs the internal clock enable signal EN_TDCLK of the logic low level when the power-up signal PWRUP is a logic low level or the falling edge detection signal MRE_LTH is the logic low level. When the power-up signal PWRUP is the logic low level, the multi-port memory device initializes the power and, therefore, the first and the second internal clock TCLK and DCLK have the logic high level. Further, the clock enable controller 9634 generates the clock buffer enable signal CLKBUF_EN. The clock buffer enable signal CLKBUF_EN is input to a phase loop clock (PLL) device included in the multi-port memory device in order to control the generation of the first and the second internal clocks TCLK and DCLK.

As shown in FIG. 23, the clock enable controller 9634 includes a tenth NAND gate NAND10, ten inverters INV15 to INV24, four transmission gates TG6 to TG9, four latches LAT1 to LAT4, and a delay DELAY. The first latch LAT1 includes an eleventh NAND gate NAND11 and an inverter INV25. The second latch LAT2 includes two inverters INV26 and INV27. The third latch LAT3 includes a twelfth NAND gate NAND12 and an inverter INV28. The fourth latch LAT4 includes two inverters INV29 and INV30.

Figure 24:
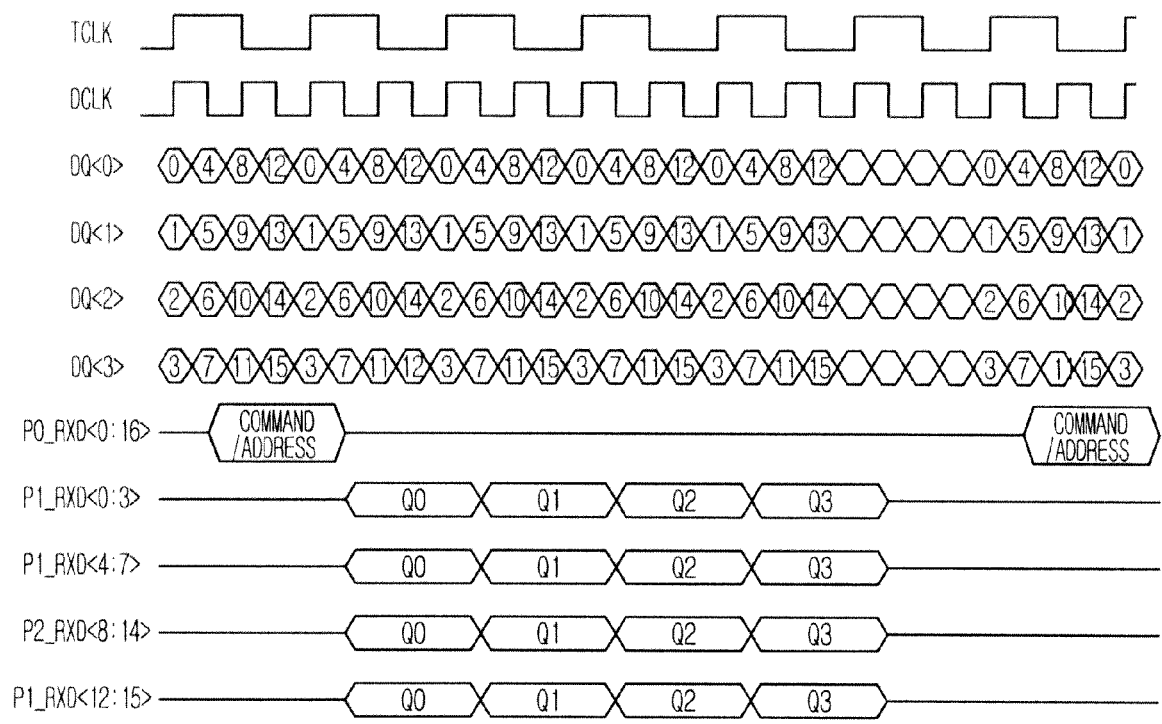
FIG. 24 is a waveform describing a write operation of the multi-port memory device shown in FIG. 9 according to the first quadruple data rate (QDR) mode.

FIG. 24 is a waveform describing a write operation of the multi-port memory device shown in FIG. 9 according to the first QDR mode QDR0.

When the mode register enable signal MREB is activated as the logic low level, the multi-port memory device operated in the DRAM core test operation mode. The I/O pads RX0+, RX0−, TX0+, and TX0− and the dummy pad S1 used for a serial data transmission between the ports PORT0 to PORT3 and the external devices is used as parallel input pads for the DRAM core test operation. The I/O controllers 91 to 94 receives the test signal P0_RXD<0:16> input through the I/O pads RX0+, RX0−, TX0+, and TX0− and the dummy pad S1 and transmits the test signal P0_RXD<0:16> to the second global data bus GIO_IN. The mode register set MRS generates the banks selection signal T_BKEN<0:7> based on the bank information signal M<0:2>. The test I/O controller 95 decodes the test signal P0_RXD<0:16> input through the second global data bus GIO_IN in response to the test enable signal DTMEN and generates internal commands and addresses. The test I/O controller 95 the test I/O signal input through the test pads DQ0 to DQ3 to the second global data bus GIO_IN in response to the first and the second internal clocks TCLK and DCLK. That is, the test I/O signal is input through the test pads DQ0 to DQ3 in synchronism with the rising edges and the falling edges of the second internal clock DCLK.

Figure 25:
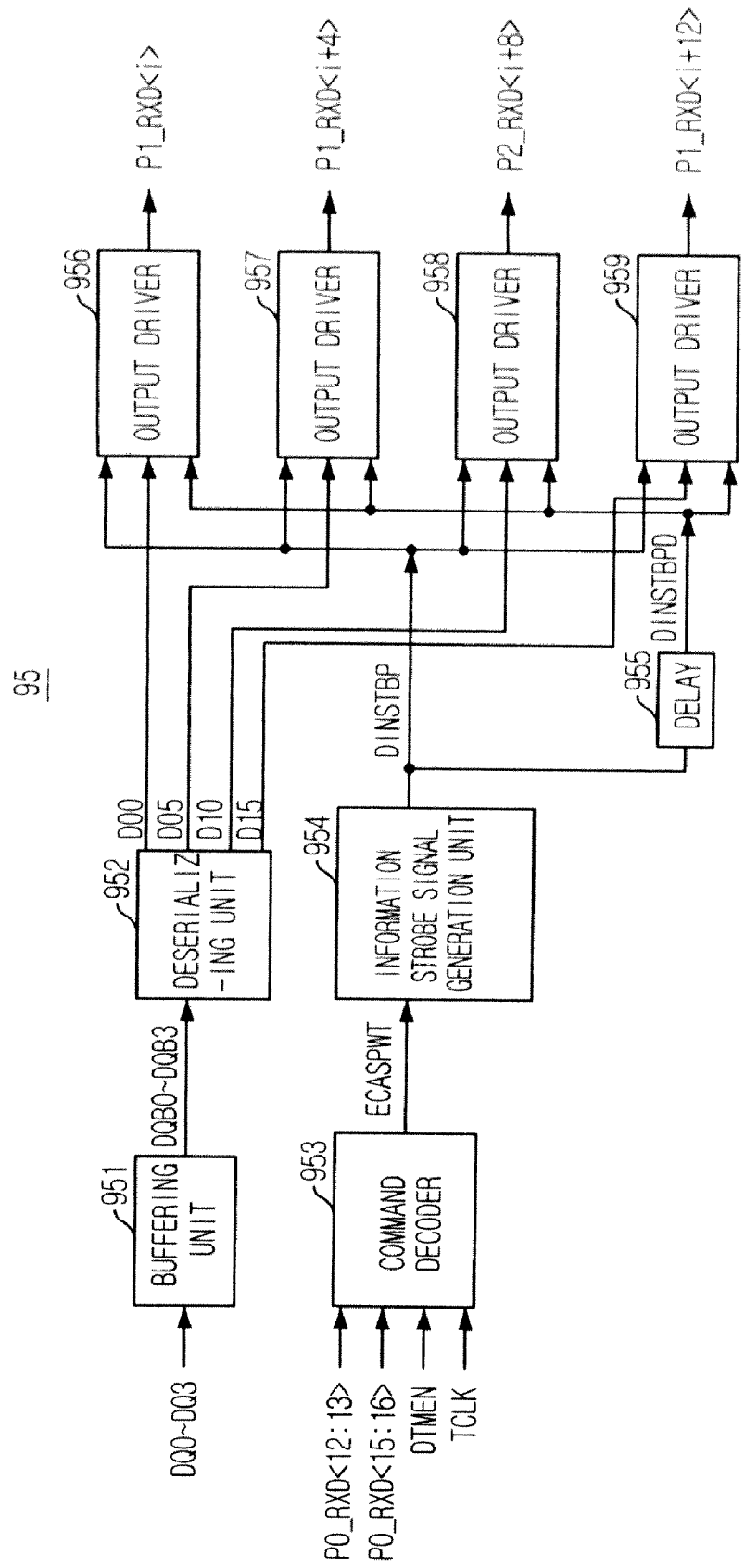
FIG. 25 is a block diagram of a test I/O controller shown in FIG. 9 for the first QDR mode.

FIG. 25 is a block diagram of the test I/O controller 95 shown in FIG. 9 for the first QDR mode QDR0.

The test I/O controller 95 includes a buffering unit 951, a deserializing unit 952, command decoder 953, an information strobe signal generation unit 954, a delay 955, four output drivers 956 to 959. The buffering unit 951 buffers the test I/O signal input through the DQ0 to D23. The deserializing unit 952 deserializes buffered test I/O signals output from the buffering unit 951. The command decoder 953 receives the test signal P0_RXD<0:16> input from the second global data bus GIO_IN in response to the test enable signal DTMEN and decodes a part P0_RXD<15:16> of the test signal P0_RXD<0:16> which includes command information to thereby generates the internal write command WRITE. The information strobe signal generation unit 954 generates an information strobe signal DINSTBP in response to the internal write command WRITE. The delay 955 delays the information strobe signal DINSTBP and outputs a delayed information strobe signal DINSTBPD. The output drivers 956 to 959 transmits deserialized test I/O signal D00 to D15 output from the deserializing unit 952 to the second global data bus GIO_IN in response to the information strobe signal DINSTBP and the delayed information strobe signal DINSTBPD.

Figure 26:
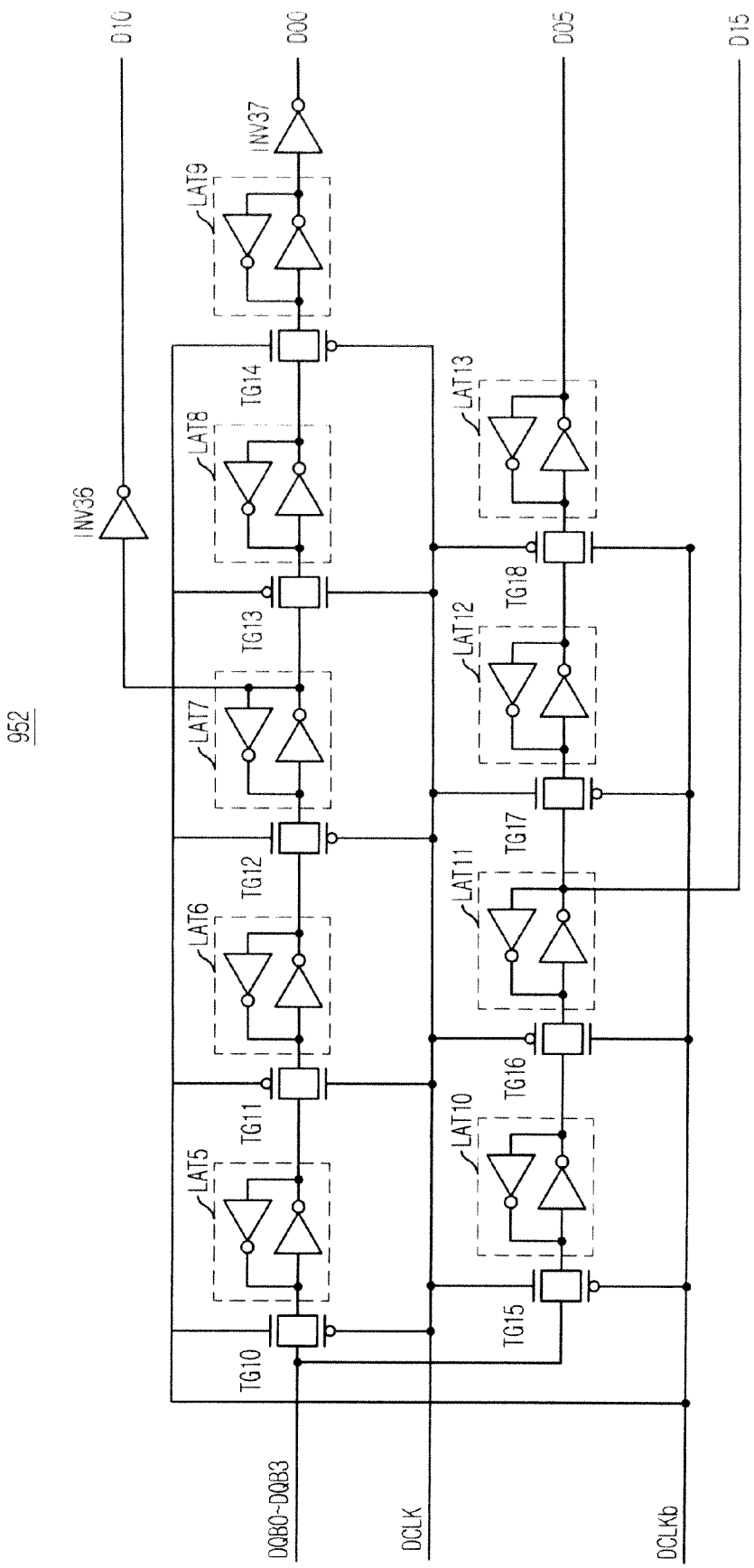
FIG. 26 is a schematic circuit diagram of a deserializing unit shown in FIG. 25.

FIG. 26 is a schematic circuit diagram of the deserializing unit 952 shown in FIG. 25.

The deserializing unit 952 is provided with shift registers latching and outputting the buffered test I/o signals in synchronism with the rising edges and the falling edges of the second internal clock DCLK. Herein, the second internal clock DCLK is twice the frequency of the first internal clock TCLK for the first QDR mode QDR0. As shown in FIG. 25, the deserializing unit 952 provided with nine transmission gates TG10 to TG18, nine latches LAT5 to LAT13, and two inverters INV25 and INV26. Each of the latches LAT5 to LAT13 is provided with two inverters. The deserializing unit 952 deserializes the test I/O signal input through the test pads DQ0 to DQ3 in synchronism with the rising edges and the falling edges of the second internal clock DCLK.

Figure 27:
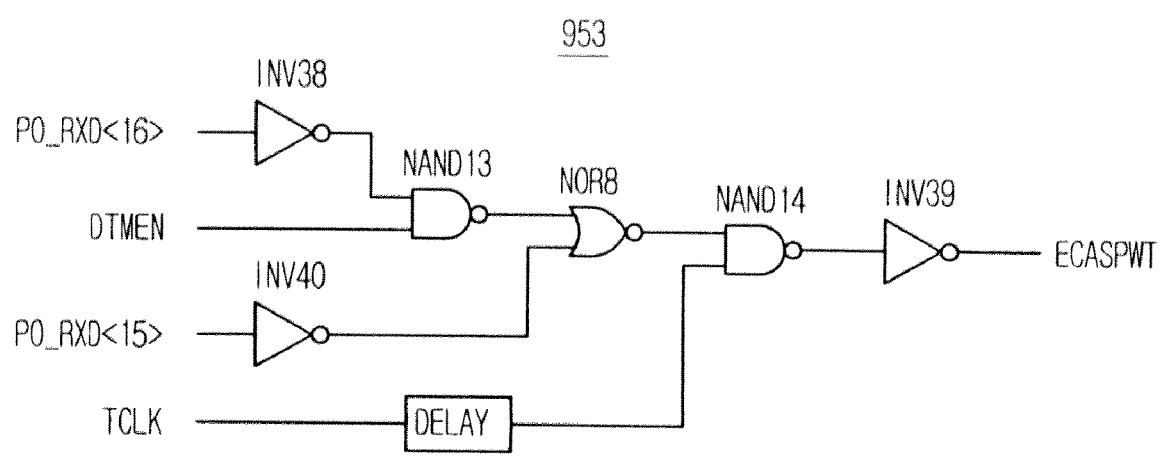
FIG. 27 is a schematic circuit diagram of a command decoder shown in FIG. 25.

FIG. 27 is a schematic circuit diagram of the command decoder 953 shown in FIG. 25.

The command decoder 953 receives the test signal P0_RXD<0:16> input from the second global data bus GIO_IN in response to the test enable signal DTMEN and decodes a part P0_RXD<15:16> of the test signal P0_RXD<0:16> which includes command information to thereby generate the internal write command WRITE. As shown in FIG. 27, the command decoder 953 includes three inverters INV27 to INV29, two NAND gates INV13 and NAND14, an eighth NOR gate NOR8, and a delay DELAY.

Figure 28:
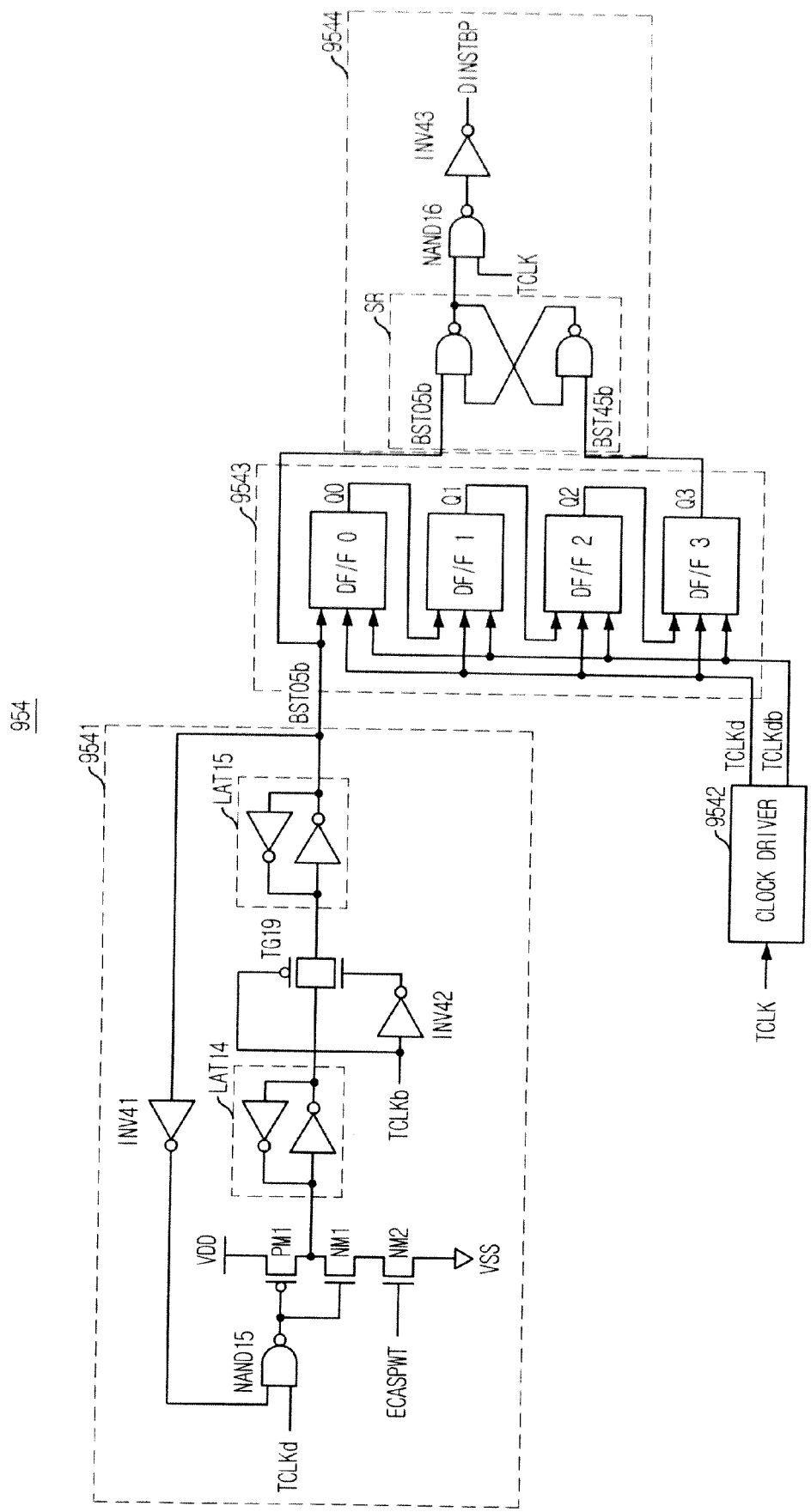
FIG. 28 is a schematic circuit diagram of an information strobe signal generation unit shown in FIG. 25.

FIG. 28 is a schematic circuit diagram of the information strobe signal generation unit 954 shown in FIG. 25.

The information strobe signal generation unit 954 generates an information strobe signal DINSTBP in response to the internal write command WRITE. The information strobe signal DINSTBP decides an output timing of the test I/O signal to the second global data bus GIO_IN through the output drivers 956 to 959. The information strobe signal DINSTBP toggles for four cycles in synchronism with the rising edge of the second internal clock DCLK after the internal write command is activated.

As shown in FIG. 28, the information strobe signal generation unit 954 includes an initial signal generation unit 9541, a clock driver 9542, a shift register unit 9543, and an information strobe signal output unit 9544. The clock driver 9542 delays the first internal clock TCLK for a predetermined time and generates a delay clock TCLKD and an inverted delay clock TCLKDB. The delay clock TCLKD and the inverted delay clock TCLKDB are complementary signals. The initial signal generation unit 9541 generates an initial signal BST05B. The shift register unit 9543 shifts and outputs the initial signal BST05B in response to the delay clock TCLKD and the inverted delay clock TCLKDB. The information strobe signal output unit 9544 latches an output of the shift register unit 9543 and the initial signal BST05B and outputs the information strobe signal DINSTBP. The initial signal generation unit 9541 includes two latches LAT14 and LAT15, a transmission gate TG19, two inverters IVN30 and INV31, a CMOS inverter, and a NMOS transistor NM2. The CMOS inverter is provided with a PMOS transistor PM1 and a NMOS transistor NM1. The shift register unit 9543 includes four D-type flip-flops DF/F0 to DF/F3. The information strobe signal output unit 9544 includes a latch SR, a NAND gate NAND16, and an inverter INV31. The latch SR latches the initial signal BST05B and an output BST45B of the shift register unit 9543. The NAND gate NAND16 logically combines an output of the latch SR and the first internal clock TCLK. The inverter INV31 inverts an output of the NAND gate NAND16 and outputs the information strobe signal DINSTBP.

Figure 29:
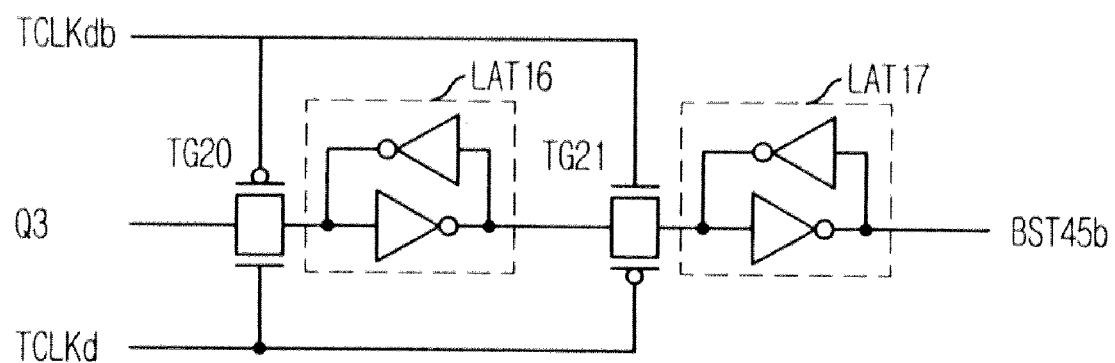
FIG. 29 is a schematic circuit diagram illustrating an internal circuit of a fourth D-type flip-flop included in a shift register unit shown in FIG. 28.

FIG. 29 is a schematic circuit diagram illustrating an internal circuit of the fourth D-type flip-flop DF/F3 included in the shift register unit 9543 shown in FIG. 28.

The fourth D-type flip-flop DF/F3 includes two transmission gates TG20 and TG21 and two latches LAT16 and LAT17. The other D-type flip-flops, i.e., DF/F0 to DF/F2, have the similar structure with the third D-type flip-flops DF/F3.

Figure 30:
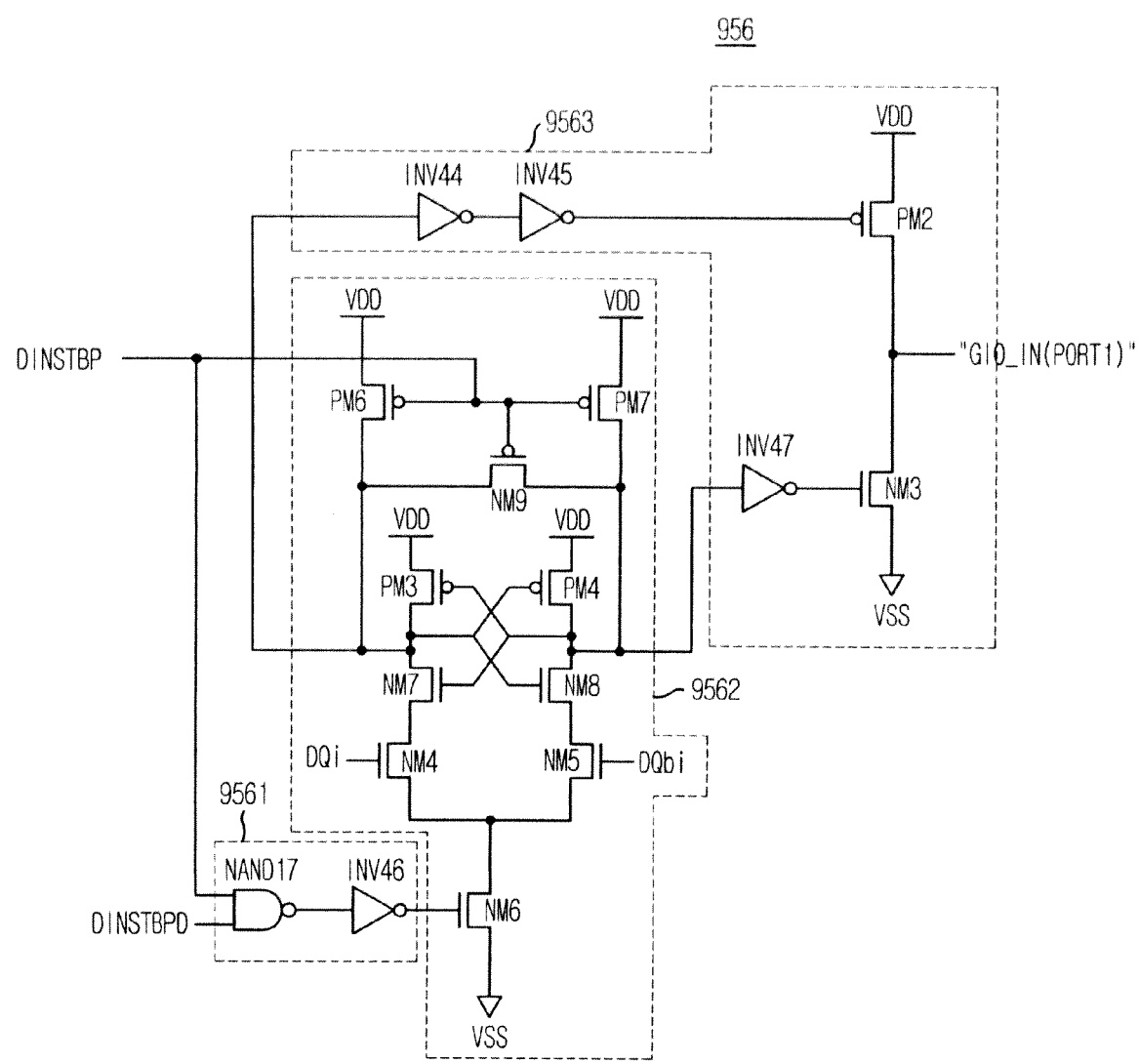
FIG. 30 is a schematic circuit diagram of a first output driver shown in FIG. 25.

FIG. 30 is a schematic circuit diagram of the first output driver 956 shown in FIG. 25.

The first output driver 956 includes a input unit 9561, a differential amplifier unit 9562 and output unit 9563. The input unit 9561 logically combines the information strobe signal DISTBP and the delayed information strobe signal DINSTBPD. The input unit 9561 is provided with a NAND gate NAND17 and an inverter INV34. The differential amplifier unit 9562 amplifies the deserialized test I/O signal D00 in response to the information strobe signal DISTBP and the delayed information strobe signal DINSTBPD. The differential amplifier unit 9562 is provided with four CMOS transistors PM3, PM4, PM6, and PM7 and six NMOS transistors NM4 to NM9. The output unit 9563 outputs an output of the differential amplifier 9562 to the second global data bus GIO_IN. The output unit 9563 is provided with a PMOS transistor PM2 and a NMOS transistor NM3, and three inverters INV32, INV33, and INV35.

Figure 31:
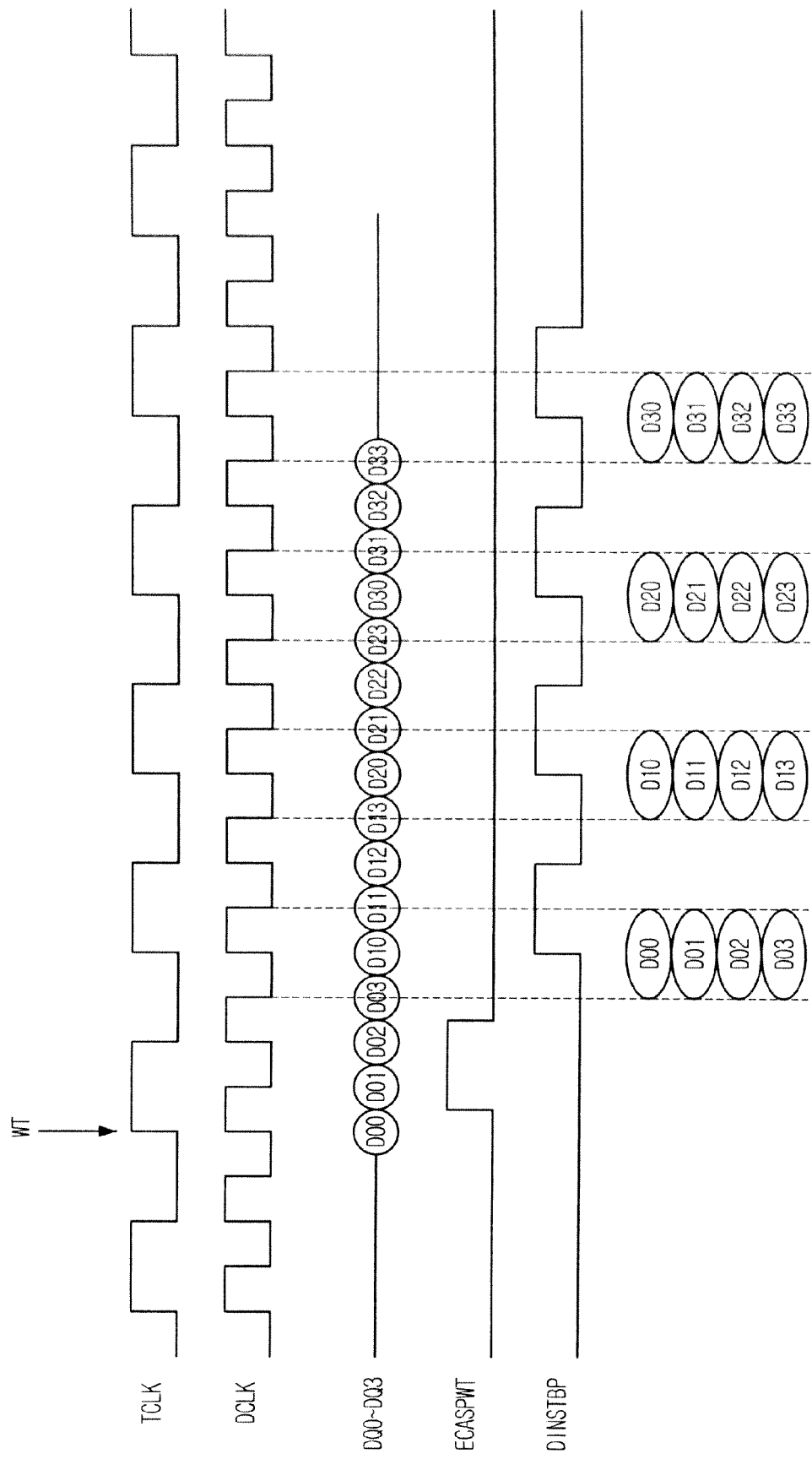
FIG. 31 is a waveform illustrating an operation of the test I/O controller for the first QDR mode QDR0 shown in FIG. 25.

FIG. 31 is a waveform illustrating an operation of the test I/O controller 95 for the first QDR mode QDR0 shown in FIG. 25.

When the DRAM core test operation mode is determined to the first QDR mode QDR0, the clock generator 96 generates the first and the second internal clocks TCLK and DCLK corresponding to the first QDR mode QDR0 and outputs them to the test I/o controller 95. The command decoder 953 of the test I/O controller 95 generates the internal write command WRITE by decoding the test signal P0_RXD<0:16> transmitted through the second global data bus GIO_IN. The information strobe signal generation unit 954 receives the internal write command WRITE and generates the information strobe signal DINSTBP toggling for four cycles in synchronism with the rising edge of the second internal clock DCLK after the internal write command is activated. The test I/O signal TEST_I/O is input through the test pads DQ0 to DQ3 in synchronism with the rising edges and the falling edges of the second internal clock DCLK. The second internal clock DCLK is twice the frequency of the first internal clock TCLK. The test I/o signal TEST_IN is input to the deserializing unit 952 through the buffering unit 951. The deserializing unit 952 deserializes the test I/o signal in synchronism with the rising edge of the information strobe signal DISTBP. The deserialized test I/o signal is transmitted to the second global data bus GIO_IN through the corresponding output drivers 956 and 959. The test I/O signal loaded to the second. global data bus GIO_IN is transmitted to a corresponding bank controller BC0 to BC7 selected by the bank selection signal T_BKEN<0:7>.

Figure 32:
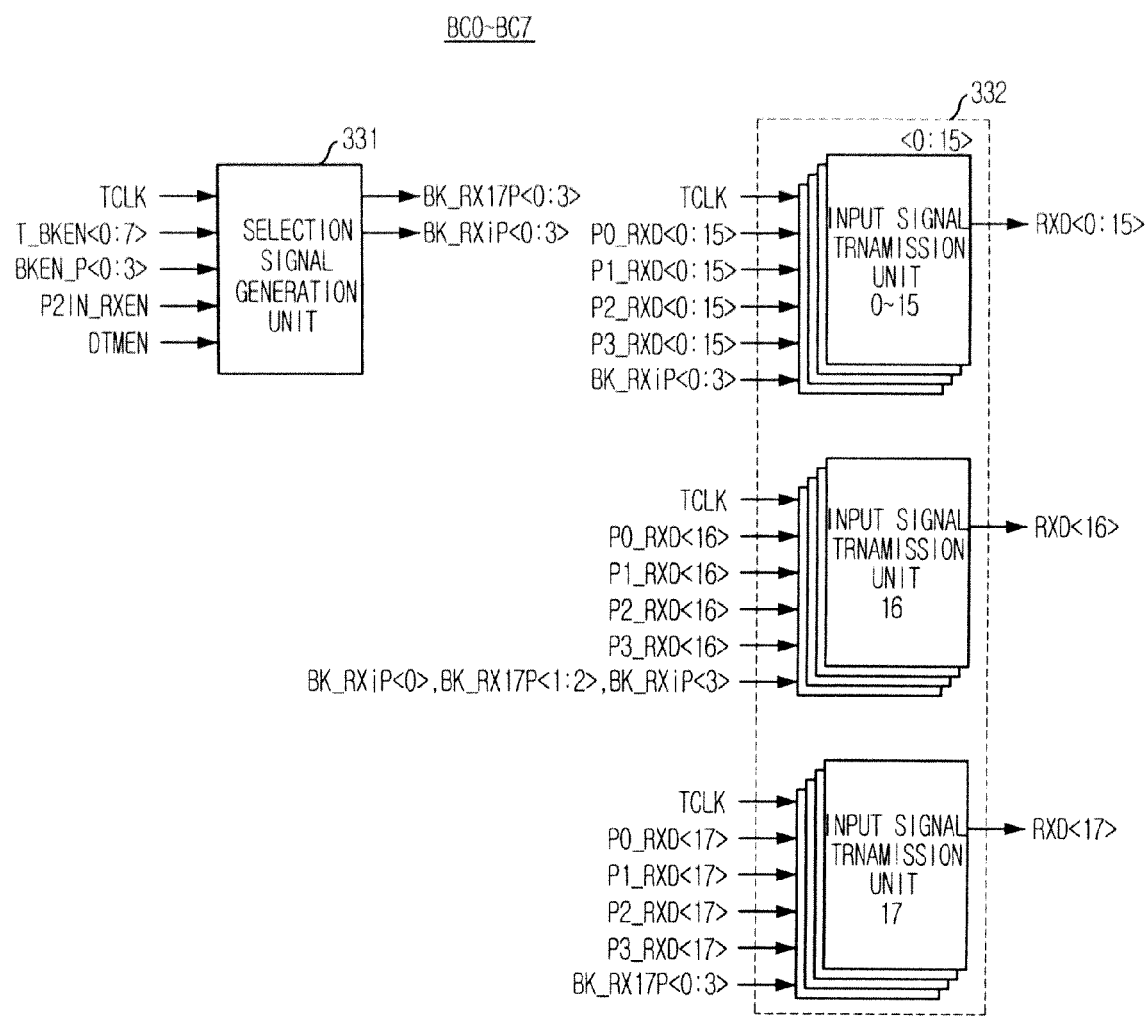
FIG. 32 is a block diagram of a first bank controller shown in FIG. 9.

FIG. 32 is a block diagram of the first bank controller BC0 shown in FIG. 9.

The first bank controller BC0 includes a selection signal generation unit 331 and an input signal transmission unit 332. The selection signal generation unit 331 generates selection signals BK_RX17P<0:3> and BK_RXiP<0:3> for selecting one of the banks BANK0 to BANK7 to which the test signal P0_RXD<0:16> and the test I/O signal TEST are transmitted. The selection signal generation unit 331 receives the first internal clock TCLK, the test enable signal DTMEN, the bank selection signal T_BKEN<0:17>, and signals BKEN_P <0:3> and P2IN_RXEN. The signal BKEN_P<0:#> is used to select the bank for the normal operation mode. The signal P2IN_RXEN transmits from a logic low level to a logic high level at a rising edge of the internal write command WRITE and transmits from the logic high level to the logic low level at a rising edge of a write command CASPWT. The write command CASWT is used for performing a write operation for the normal operation mode. The input signal transmission unit 332 selects one of the signals P0_RXD<0:17> to P3<0:17> and transmits the selected one to a corresponding bank in response to the selection signals BK_RX17P<0:3> and BK_RXiP<0:3>. Herein, the signals P1_RXD<0:17> to P3_RXD<0:17> are input during the normal operation through the ports PORT1 to PORT3 and different from the test signal P0_RXD<0:16>. The input signal transmission unit 332 includes seventeen input signal transmitters INPUT SIGNAL TRANSMITTER0 TO INPUT SIGNAL TRANSMITTER17. The other bank controllers BC1 to BC7 have the similar structure with the first bank controller BC0 shown in FIG. 32.

Figure 33:
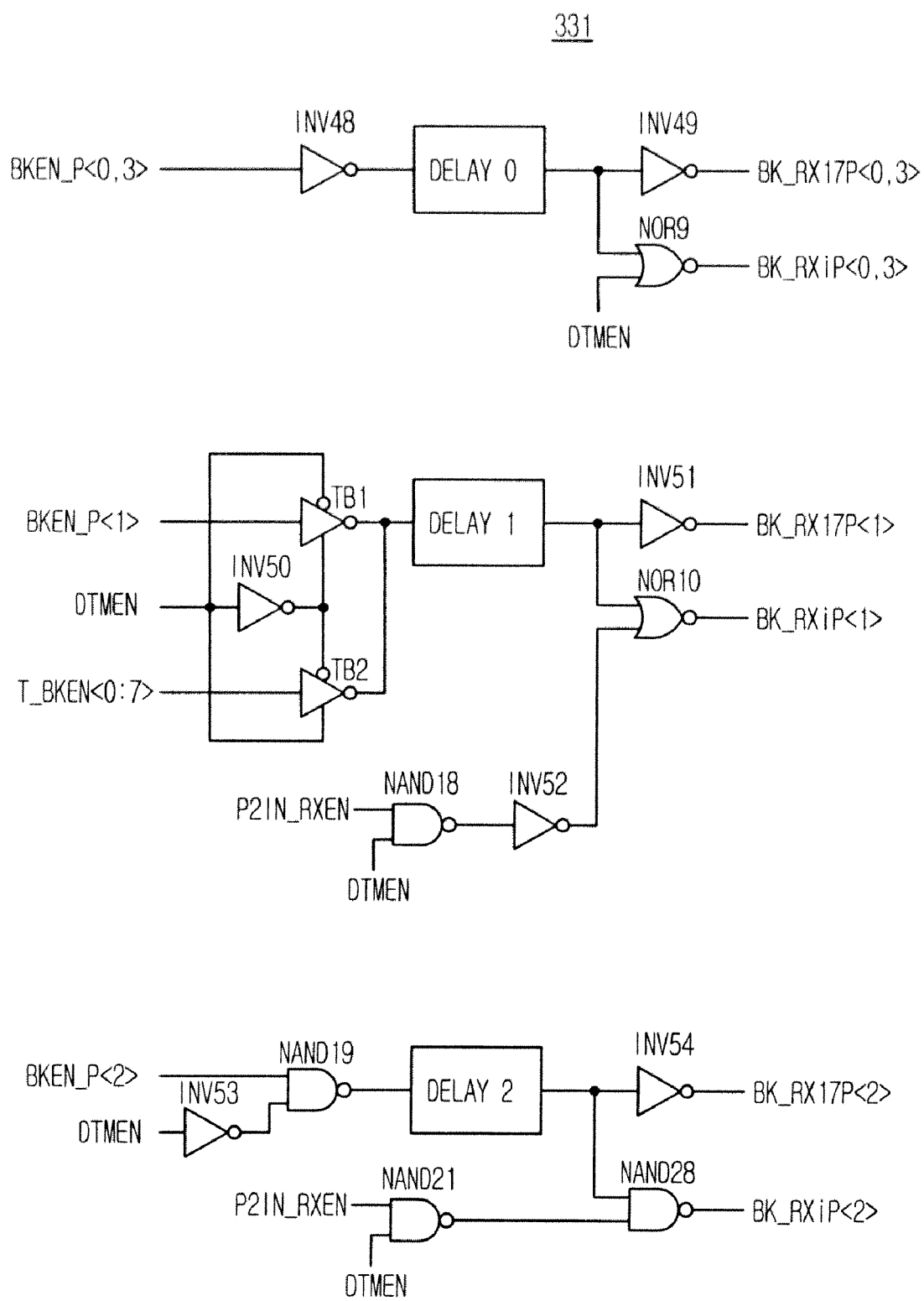
FIG. 33 is a schematic circuit diagram of a R2IN_RXEN generation unit.

FIG. 33 is a schematic circuit diagram of the selection signal generation unit 331 shown in FIG. 32

The selection signal generation unit 331 includes three delays DELAY0 to DELAY2, seven inverters INV48 to INV54, two NOR gates NOR9 and NOR10, four NAND gates NAND18 to NAND21, and two tri-state buffers TB1 and TB2. The selection signals BK_RXi<0> and BK_RXiP<3> become a logic low level when the test enable signal DTMEN is the logic high level. The selection signal BK_RXiP<0> becomes one of the bank selection signal T_BKEN<0:7> corresponding to a selected bank when the test enable signal DTMEN is the logic high level and the signal P2INRXEN is the logic low level. Meanwhile, when the signal P2INRXEN is the logic high level and the test enable signal is the logic low level, the selection signal BK_RXiP<1> becomes a logic low level. The selection signal BK_RXiP<2> becomes a logic high level when the test enable signal DTMEN is the logic high level and the signal P2INRXEN is the logic high level. Otherwise, the selection signal BK_RXiP<2> is a logic low level. Further, the selection signals BK_RX17P<0> and BK_RX17P<3> have the same state with the bank enable signals BKEN_P<0> and BKEN_P<3> for the normal operation mode. The selection signal BK_RX17P<1> has the state same with a corresponding hank selection signal T_BKEN<0:7>. The BK_RX17P<2> has a logic low level during the DRAM core test operation mode.

Figure 34:
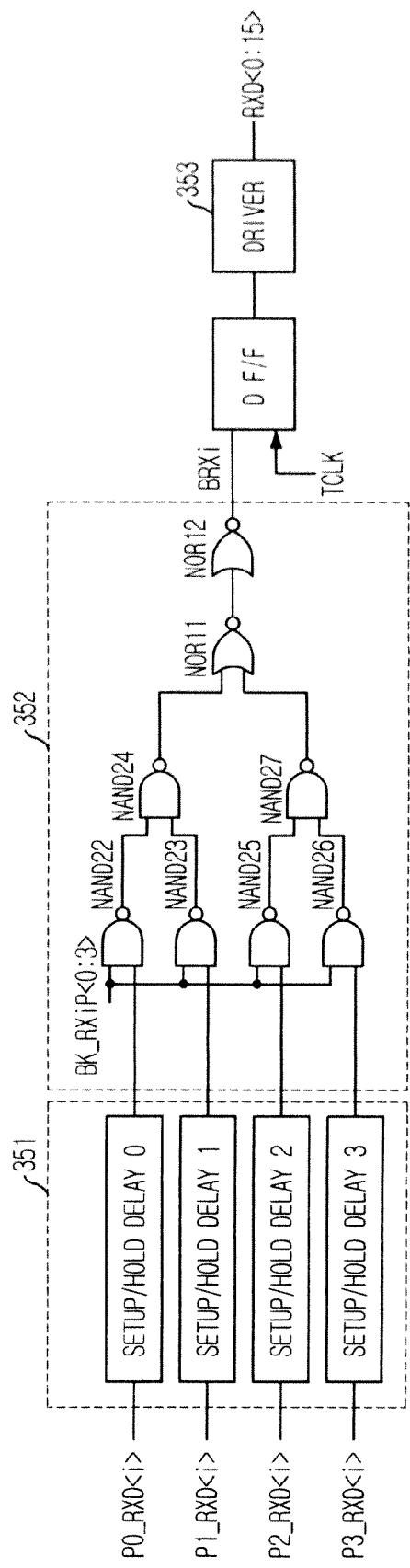
FIG. 34 is a schematic circuit diagram of a selection signal generation unit shown in FIG. 32.

FIG. 34 is schematic circuit diagram of the first input signal transmitter INPUT SIGNAL TRANSMITTER0 shown in FIG. 32.

The first input signal transmitter INPUT SIGNAL TRANSMITTER0 includes setup/hold delay unit 351, a selection unit 352, a D-type flip-flop DF/F, and a driver 353. The setup/hold delay unit 351 includes four setup/hold delays SETUP/HOLD DELAY0 to SETUP/HOLD DELAY3. The setup/hold delays SETUP/HOLD DELAY0 to SETUP/HOLD DELAY3 respectively receive the signals P0_RXD<0> to P3_RXD<0> and adjusts setup/hold of the signals P0_RXD<0> to P3_RXD<0>. The selection unit 352 selects one of outputs of the setup/hold delay unit 351 in response to the selection signal BK_RXiP<0:3>. The D-type flip-flop DF/F synchronizes selected one BRXi by the selection unit 352 with the first internal clock TCLK. The driver 353 outputs an output of the D-type flip-flop DF/F as a selected signal RXD<0>. The second to sixteenth input signal transmitters INPUT SIGNAL TRANSMITTER1 to INPUT SIGNAL TRANSMITTER15 have the similar structure with the first input signal transmitter INPUT SIGNAL TRANSMITTER0.

Hereinafter, an operation of the input signal transmitters INPUT SIGNAL TRANSMITTER0 to SIGNAL TRANSMITTER15 for the DRAM core test operation mode is described.

After the test enable signal DTMEN becomes the logic high level, the input signal transmitters INPUT SIGNAL TRANSMITTER0 to SIGNAL TRANSMITTER15 selects the signal P0_RXD<0:15> and synchronizes it with the first internal clock TCLK. The signal P0_RXD<0:15> corresponds to the test signal. The test I/O controller 95 generates the internal write command WRITE by decoding the test signal P0_RXD<0:15>. The P2IN_RXEN generation unit generates the signal P2IN_RXEN in response to the internal write command WRITE. Then, the test I/O signal is transmitted to a corresponding bank through the second global data bus GIO_IN.

Figure 35:
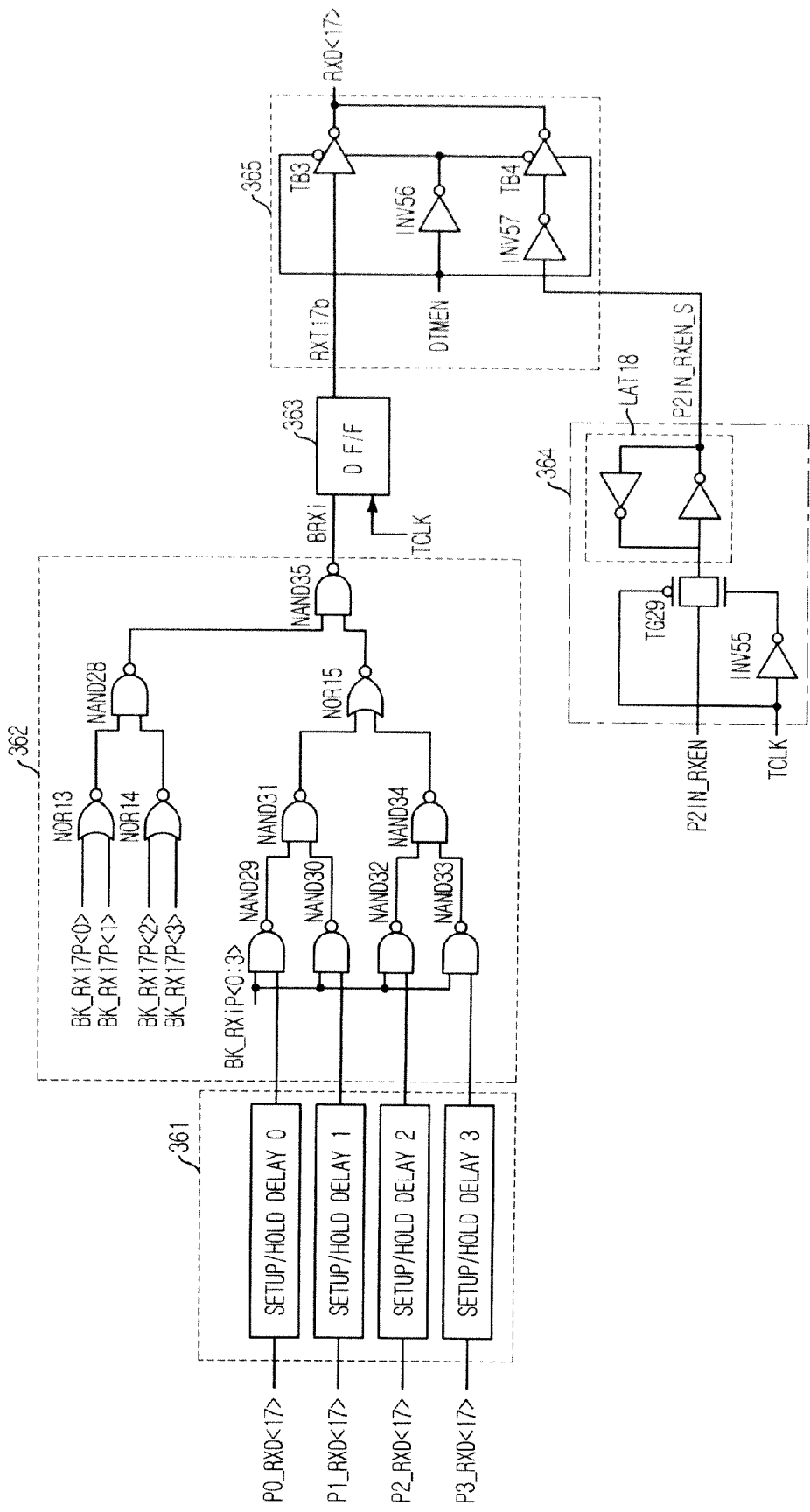
FIG. 35 is a schematic circuit diagram of a first input signal transmitter shown in FIG. 32.

FIG. 35 is a schematic circuit diagram of the eighteenth input signal transmitter INPUT SIGNAL TRANSMITTER17 shown in FIG. 32.

The seventeenth input signal transmitter INPUT SIGNAL TRANSMITTER17 includes a setup/hold delay unit 361, a selection unit 362, a D-type flip-flop DF/F, a latch unit 363, and a drive unit 364. The setup/hold delay unit 361 includes four setup/hold delays. The setup/hold delays respectively receive the signals P0_RXD<17> to P3_RXD<17> and adjusts setup/hold of the signals P0_RXD<17> to P3_RXD<17>. The selection unit 362 selects one of outputs of the setup/hold delay unit 361 in response to the selection signal BK_RX17P<0:3>. The D-type flip-flop DF/F synchronizes selected one BRXi by the selection unit 362 with the first internal clock TCLK. The latch unit 363 latches the signal P2INRXEN in response to the first internal clock TCLK. The drive unit 364 selects one of output RXT17B of the D-type flip-flop DF/F and output I2IN_RXEN_S of the latch unit 363 in response to the test enable signal DTMEN and outputs the selected one as the selected data RXD<17>. The selection unit 362 includes three NOR gates NOR13 to NOR15 and eight NAND gates NAND28 to NAND36. The latch unit 363 includes a transmission gate TG21, an inverter INV43, a latch LAT18. The drive unit 364 includes two inverters INV44 and INV45 and two tri-state buffers TB3 and TB4.

Figure 1:
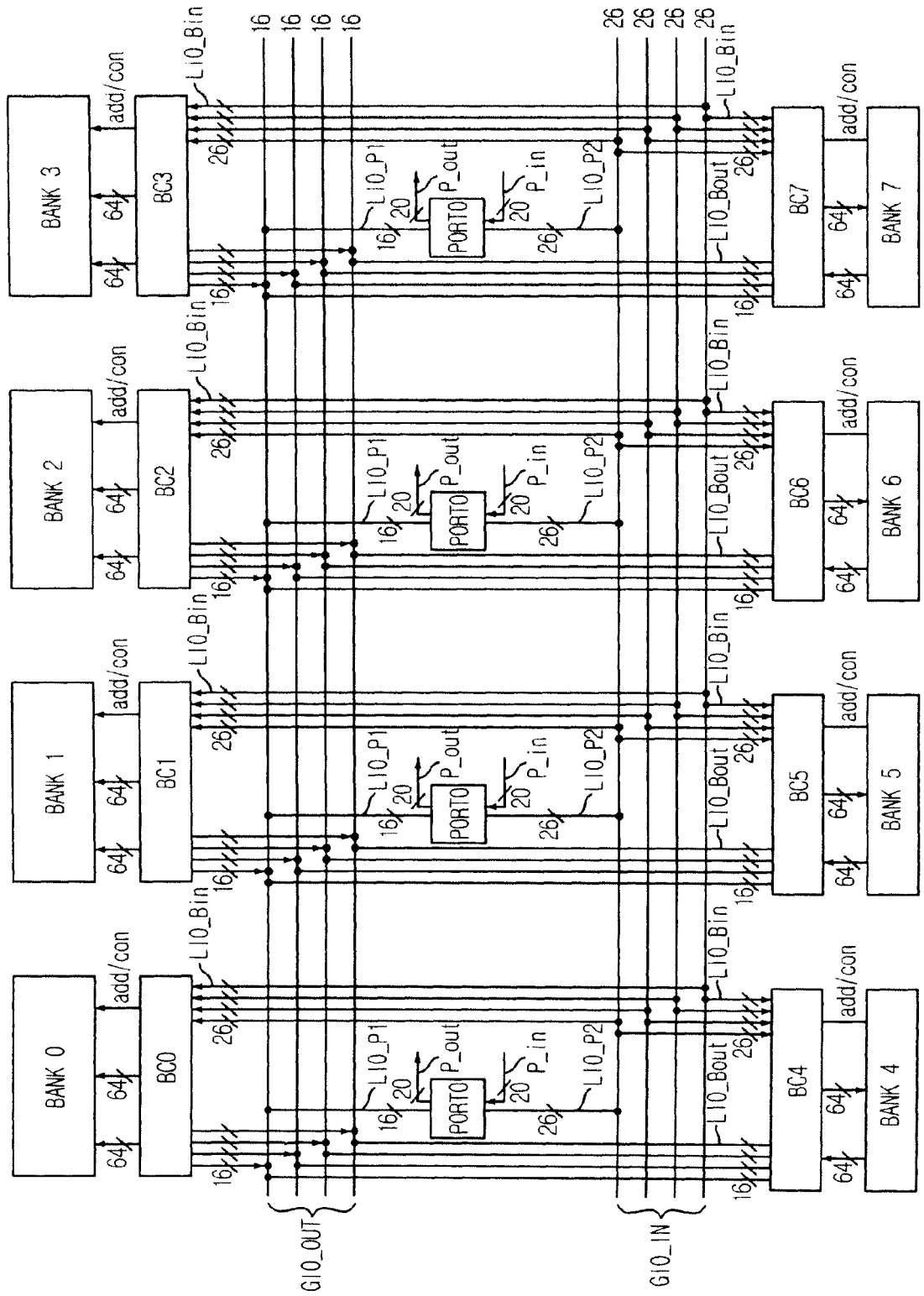
FIG. 1 is a block diagram of a conventional multi-port memory device.
Figure 2:
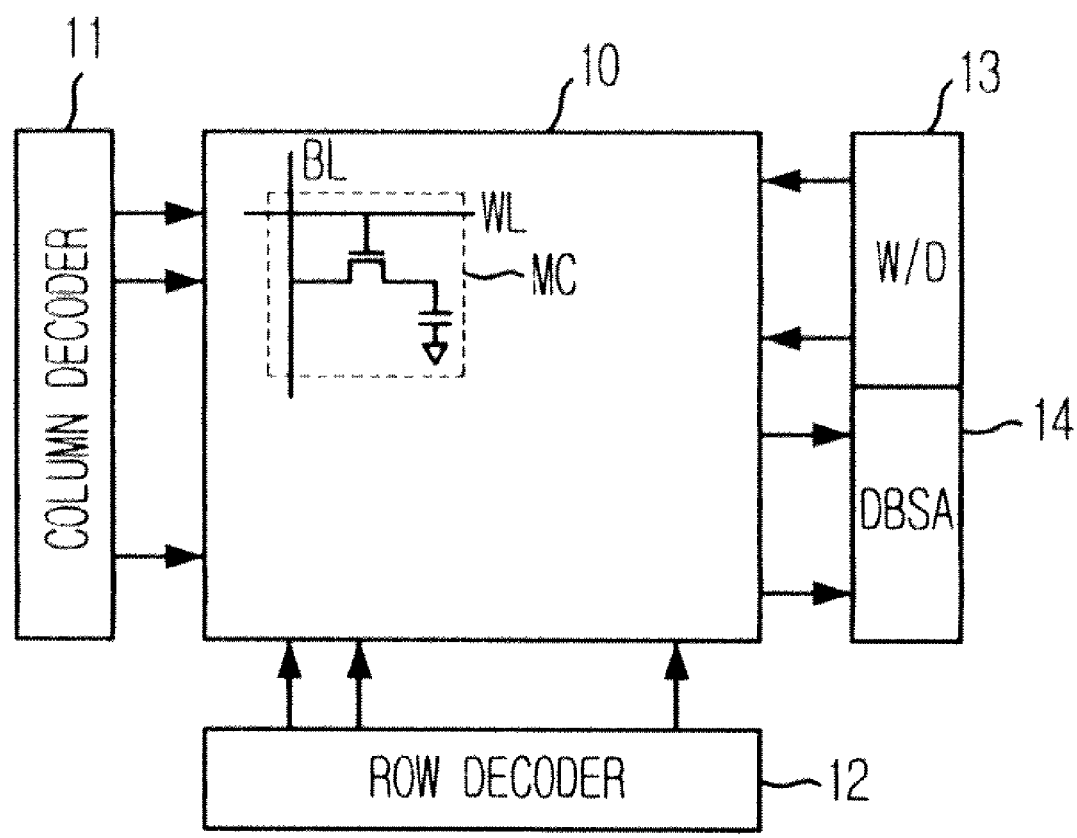
FIG. 2 is a detailed block diagram of the first bank shown in FIG. 1.
Figure 3:
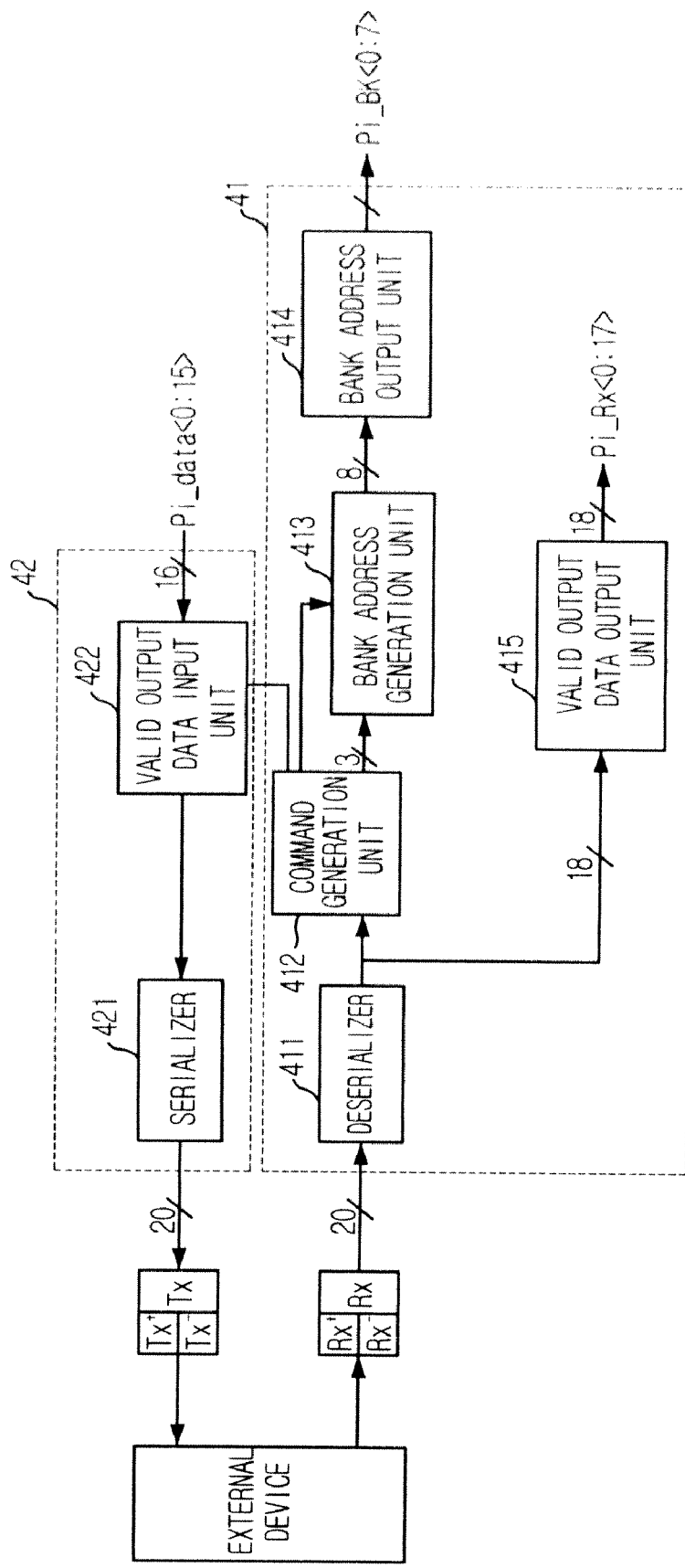
FIG. 3 is a block diagram of the first port illustrated in FIG. 1.
Figure 4A:
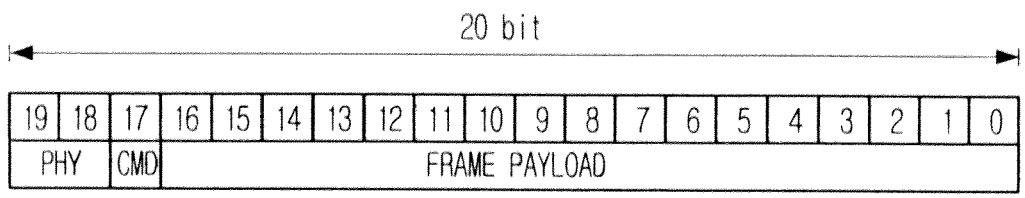
FIGS. 4A to 4F are frame formats of the input signals input to the first port shown in FIG. 3.
Figure 4B:
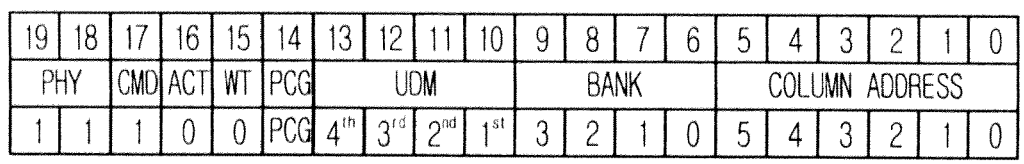
Figure 4C:
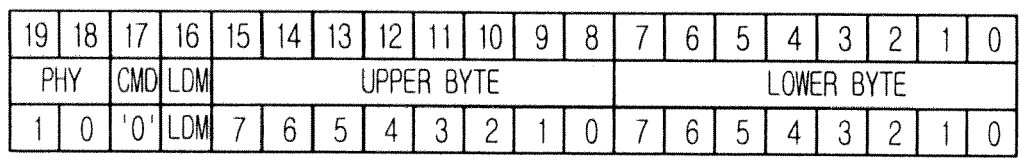
Figure 4D:
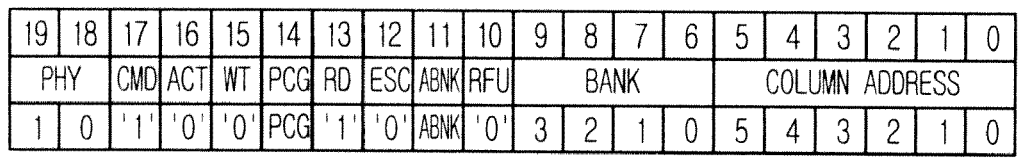
Figure 4E:
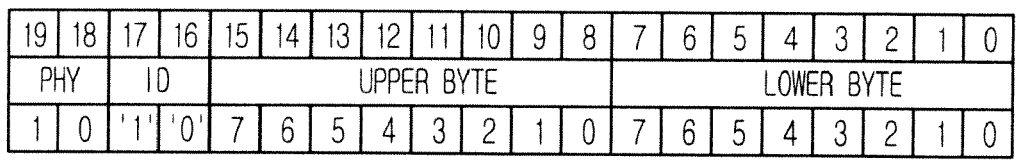
Figure 4F:
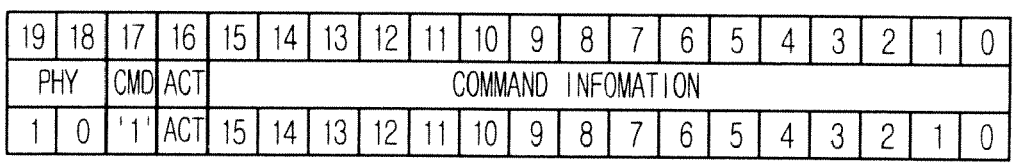
Figure 5:
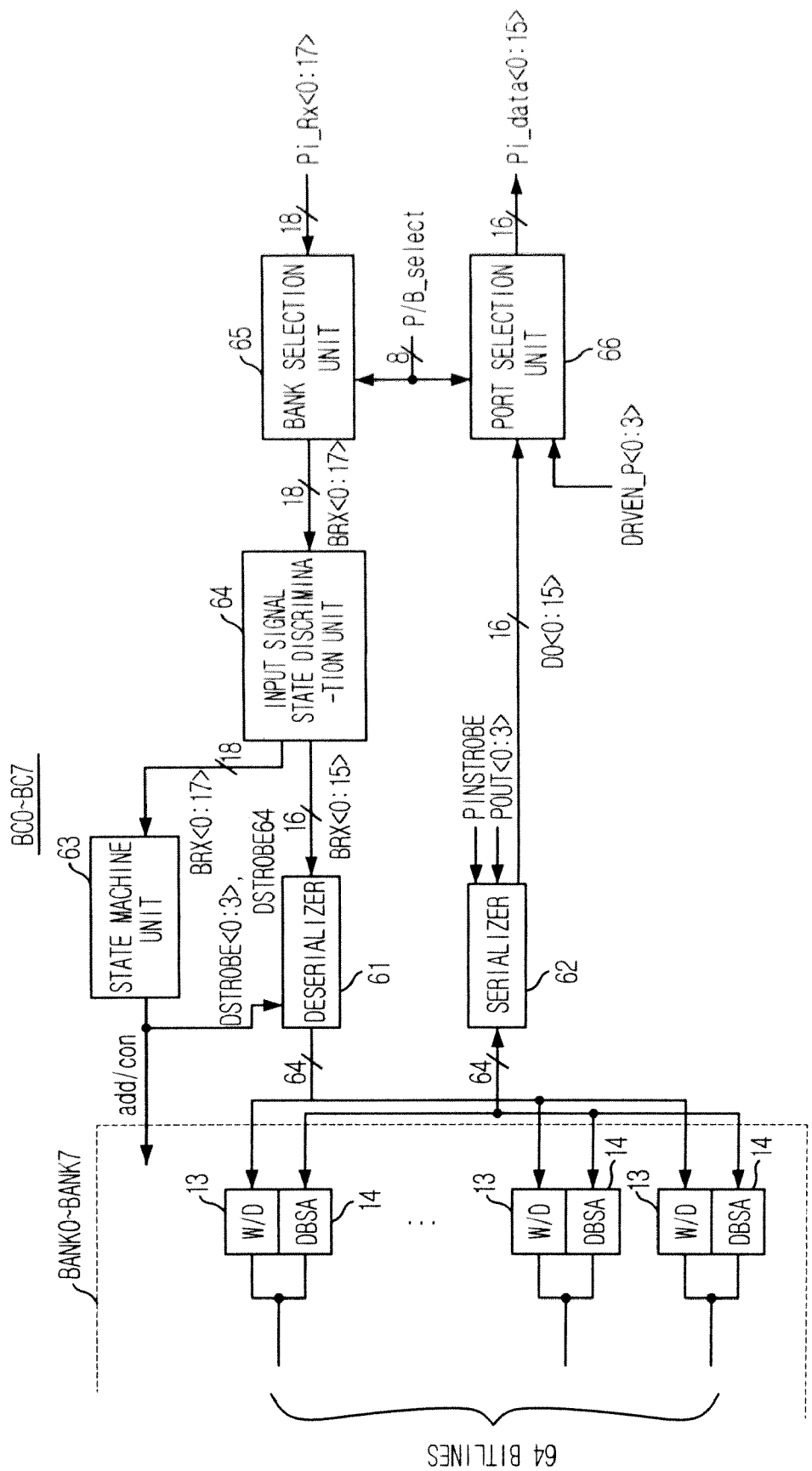
FIG. 5 is a detailed block diagram of the first bank control unit shown in FIG. 1.
Figure 6:
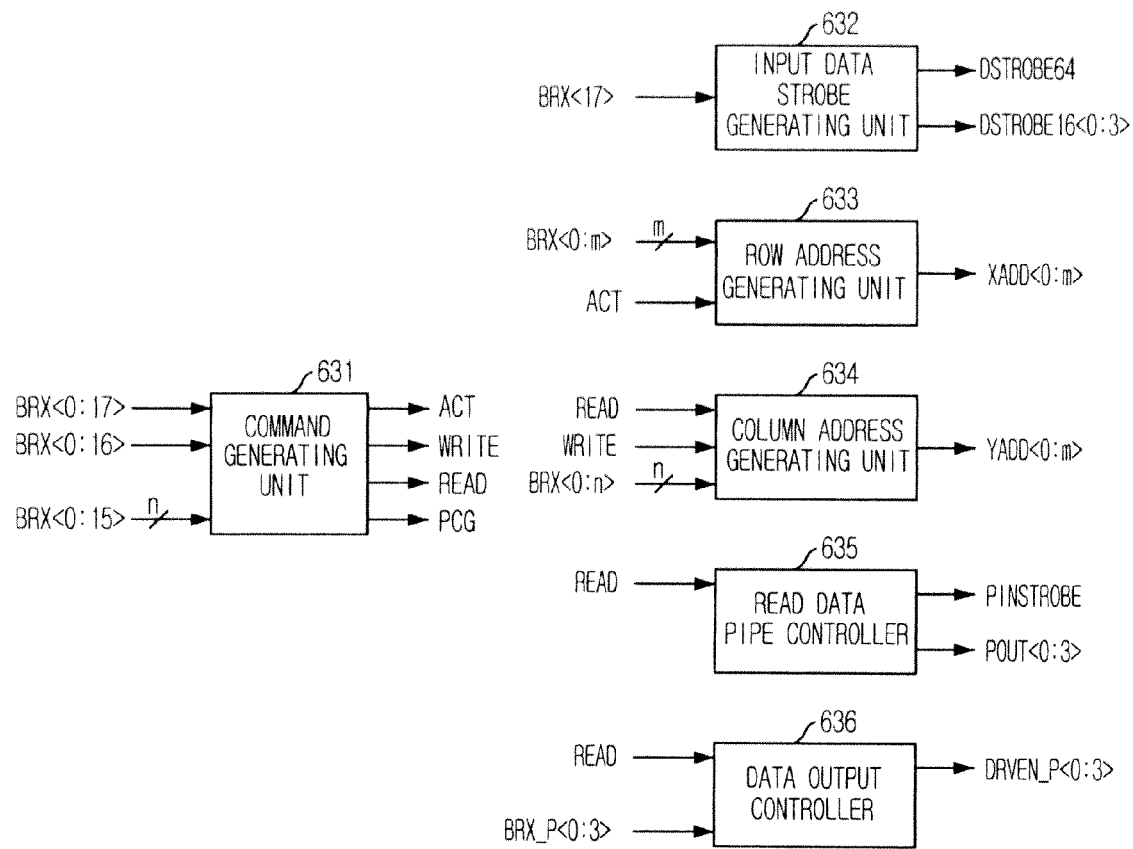
FIG. 6 is a circuit diagram of the state machine unit 63 shown in FIG. 5.
Figure 7:
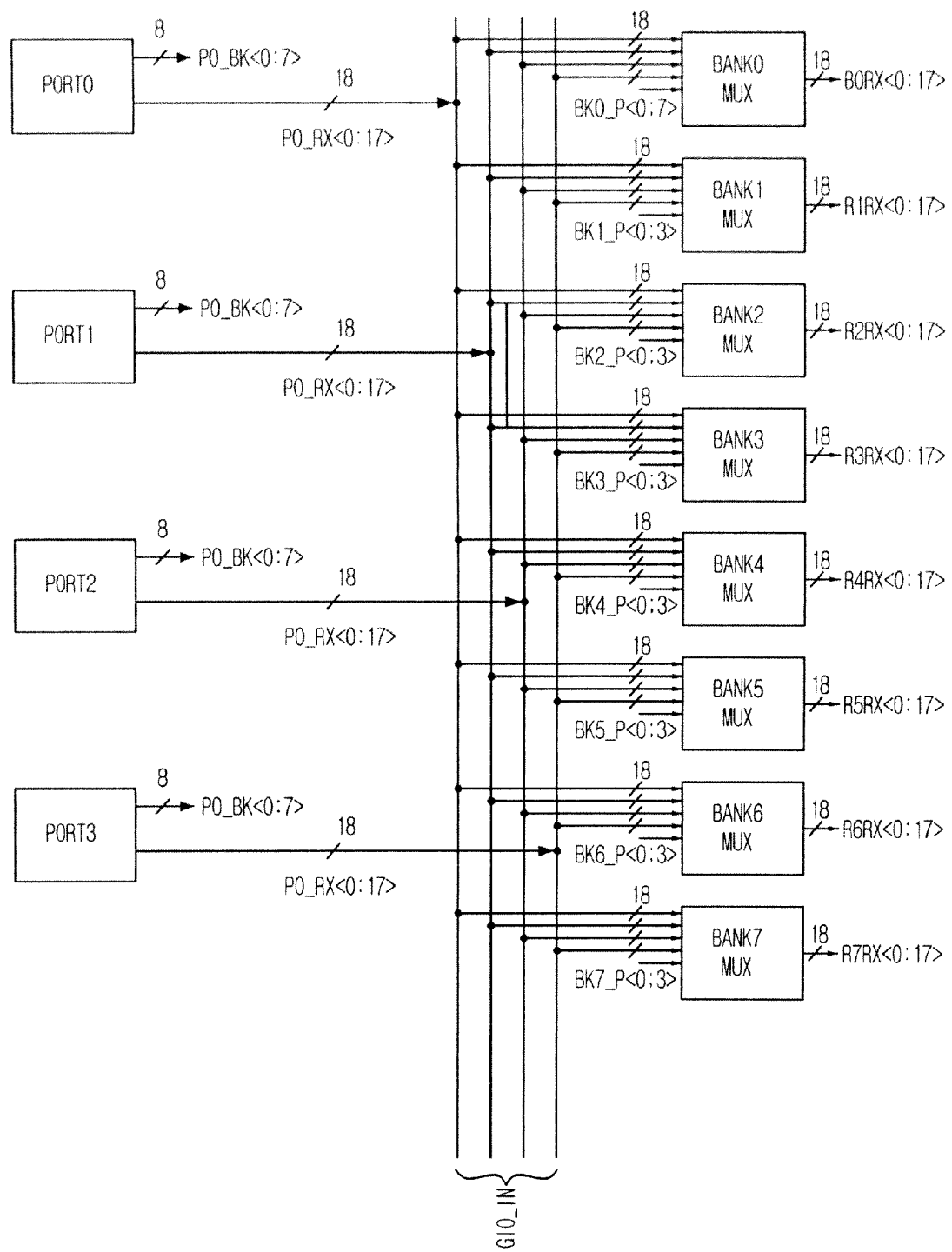
FIG. 7 is a signal diagram illustrating a signal input path from ports to banks.
Figure 8:
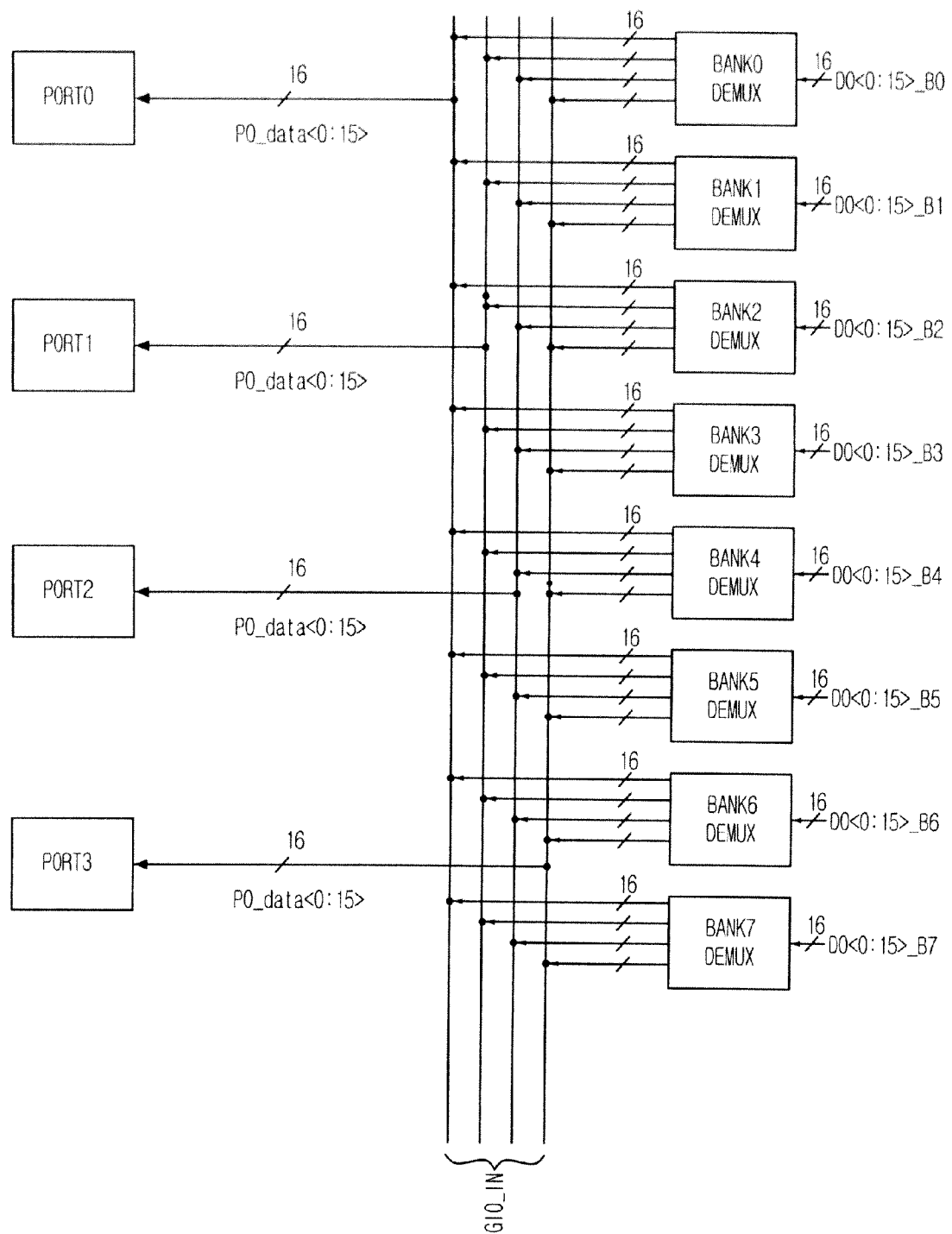
FIG. 8 is a signal diagram illustrating a signal output path from banks to ports.

Meanwhile, the seventeenth input signal transmitter INPUT SIGNAL TRANSMITTER16 can be implemented with the circuitry similar to that shown in FIG. 35. That is, seventeenth input signal transmitter INPUT SIGNAL TRANSMITTER16 selects one of the signals P0_RXD<16> to P3_RXD<16> in response to the selection signals BK_RXiP<0>, BK_RX17_P<1:2>, and BK_RXiP<3> and outputs the selected one as the selected data RXD<16>. The selected signal RXD<16> is used a LDM bit shown in FIG. 4C. The selected signal RXD<16> is generated from the test signal P0_RXD<16> input through the dummy pad S1. Meanwhile, the test signal P0_RXD<17> is used as a command bit and maintains a logic high level during the DRAM core test operation mode and instantaneously holds a logic low level at the moment that the test I/o signal is input after the internal write command WRITE is input.

Figure 36:
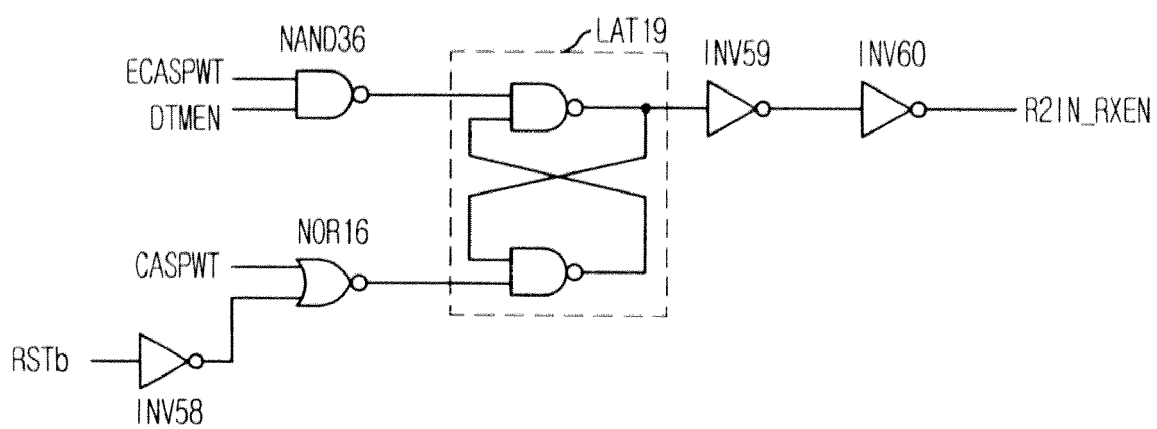
FIG. 36 is a schematic circuit diagram of the eighteenth input signal transmitter shown in FIG. 32.

FIG. 36 is a schematic circuit diagram of a R2IN_RXEN generation unit.

As shown, the R2IN_RXEN generation unit includes a NAND gate NAND36, a NOR gate NOR16, a latch LAT19, and three inverters INV58 to INV60.

Next, the write operation for the second QDR mode QDR1 is similar to that of the first QDR mode QDR0 only except that the multi-port memory device writes data in response to the rising edges and the falling edges of the first and the second internal clocks TCLK and DCLK. Therefore, a detailed explanation about the write operation for the second QDR mode QDR1 is eliminated.

Figure 37:
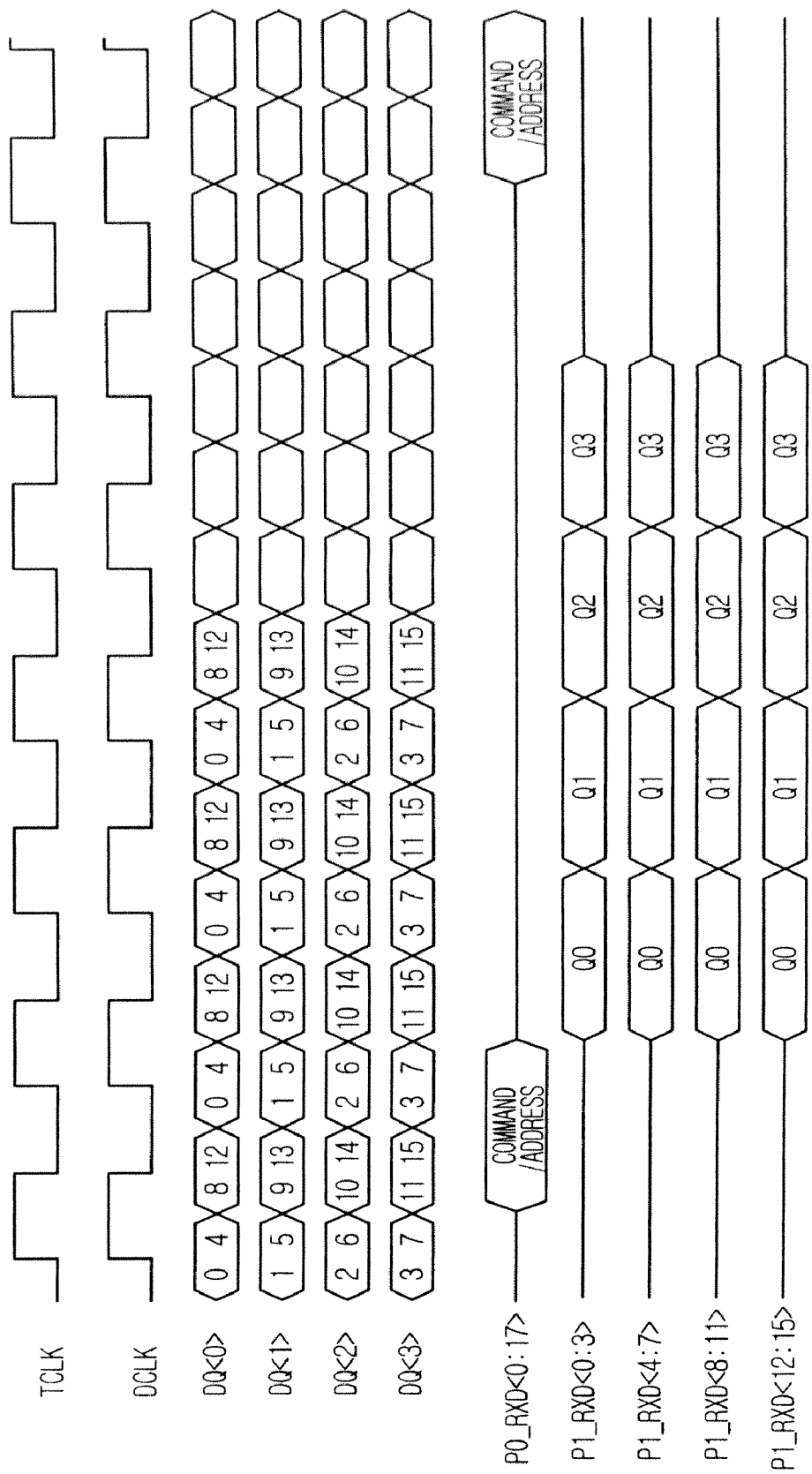
FIG. 37 is a waveform illustrating a write operation for a double data rate (DDR) mode.

FIG. 37 is a waveform illustrating a write operation for the DDR mode.

For the DDR mode, the second clock DCLK has the same pulse as the first internal clock TCLK. The data is input at the rising edges and the falling edges of one of the first and the second internal clocks TCLK and DCLK.

Figure 38:
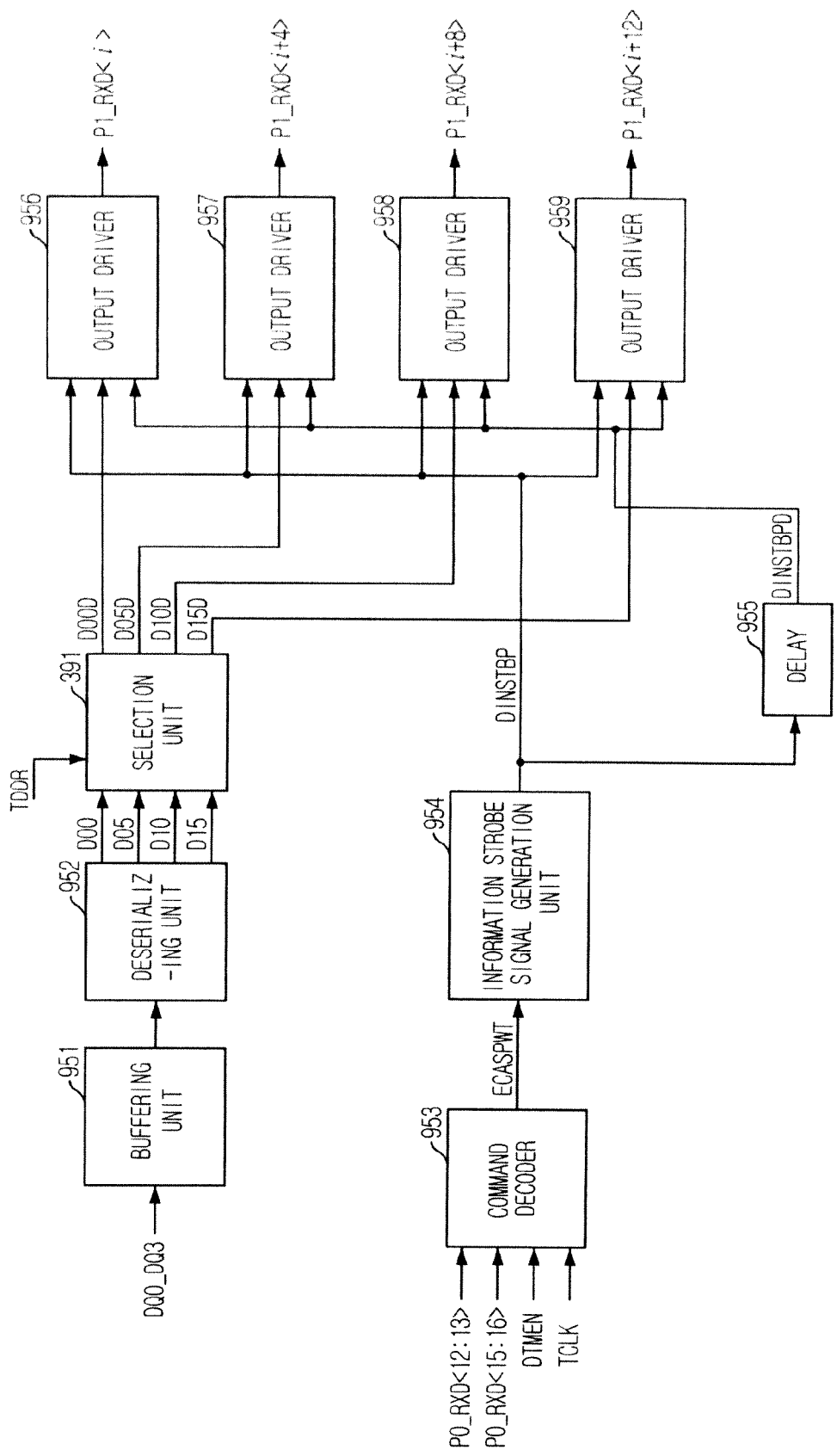
FIG. 38 is a block diagram of the test I/O controller for the DDR mode.

FIG. 38 is a block diagram of the test I/O controller 95 for the DDR mode.

AS shown, the test I/O controller 95 is similar to that shown in FIG. 25, however, further includes a selection unit 391. As mentioned above, during the first QDR mode QDR0, the data is input at the falling edges and the rising edges of the first and the second internal clocks TCLK and DCLK. Meanwhile, for the DDR mode, the data is input at the rising edges and the falling edges of one of the first and the second internal clocks TCLK and DCLK. Therefore, while the sixteen bit data, for example, is input during one cycle of the first internal clock TCLK for the first QDR mode QDR0, the eight bit data is input during one cycle of the first internal clock TCLK for the DDR mode. Thus, it is required to deserialize the eight bit data and make the sixteen bit data in order to load the data to the second global data bus GIO_IN. Therefore, the deserializing unit 952 deserializes the eight bit data and outputs sixteen bits data and the selection unit 391 selects a required data in response to the mode selection signal TDDR.

Figure 39:
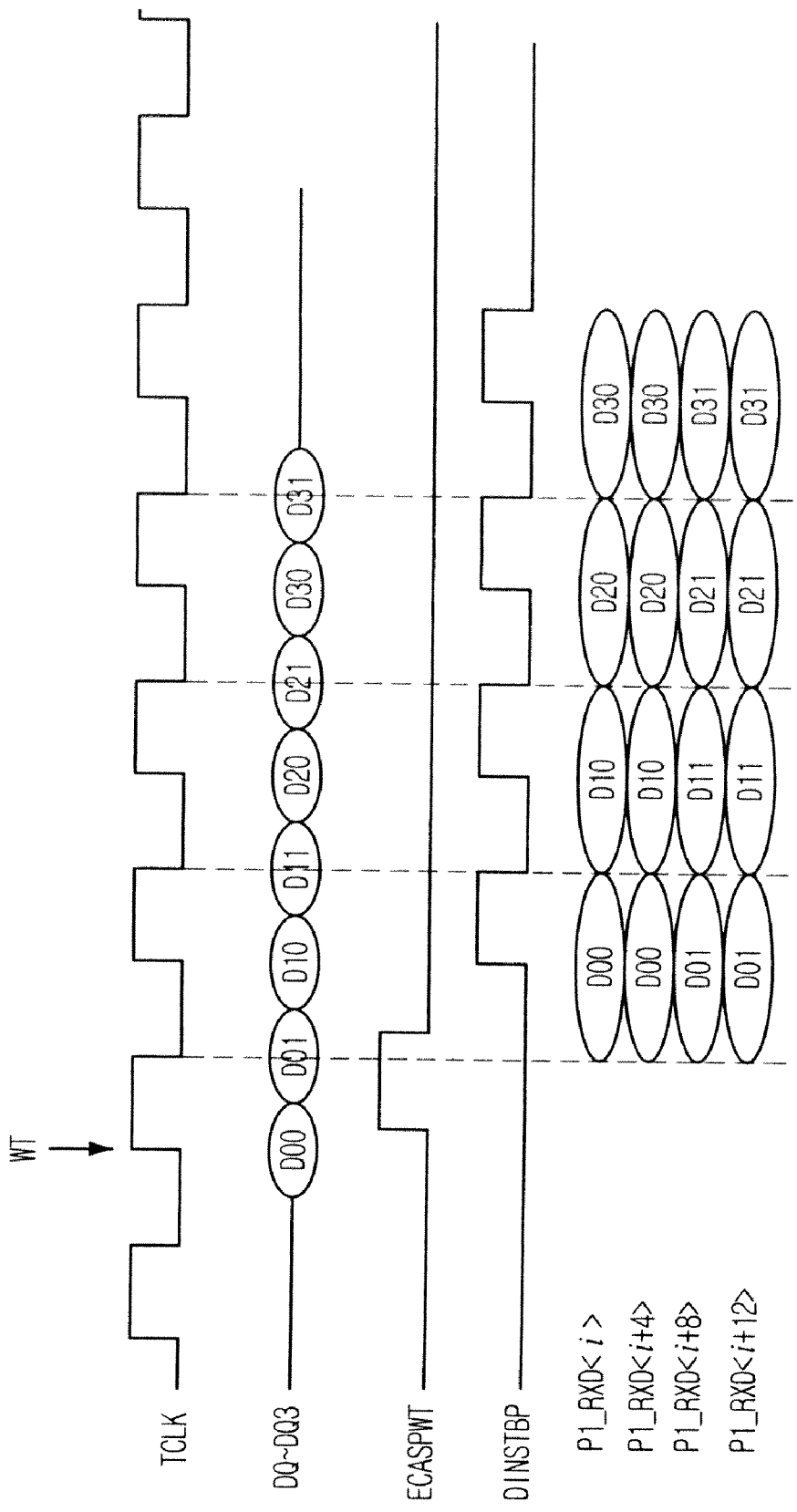
FIG. 39 is a waveform illustrating an operation of the test I/O controller shown in FIG. 38.

FIG. 39 is a waveform illustrating an operation of the test I/O controller shown in FIG. 38.

The deserializing unit 952 deserializes the test I/o signal serially input through the test pads DQ0 to DQ3 in response to the information strobe signal DINSTBP.

Figure 40:
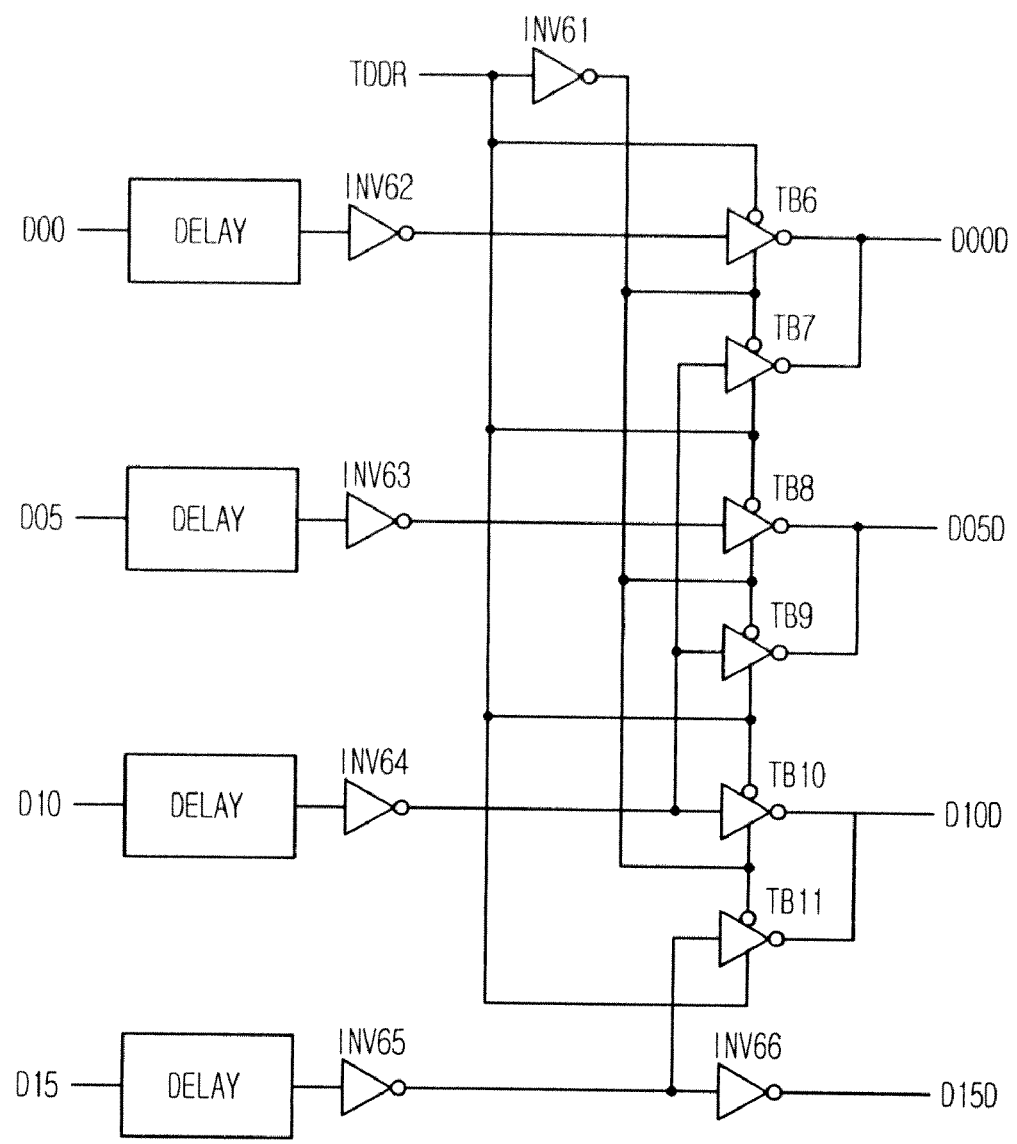
FIG. 40 is a schematic circuit diagram of the selection unit 381 shown in FIG. 38.

FIG. 40 is a schematic circuit diagram of the selection unit 391 shown in FIG. 38.

The selection unit 391 includes four delays, six inverters INV62 to INV65, and six tri-state buffers TB6 to TB11. The selection units 391 receives outputs D00 to D15 of the deserializing unit 952 and selects the outputs D10 and D15 in response to the mode selection signal TDDR in order to transmit the selected outputs D10 and D15 to the output drivers 956 to 959.

The detailed explanation about the other blocks included in the test I/O controller 95 is eliminated because their operation is the same as those shown in FIG. 25.

Figure 41:
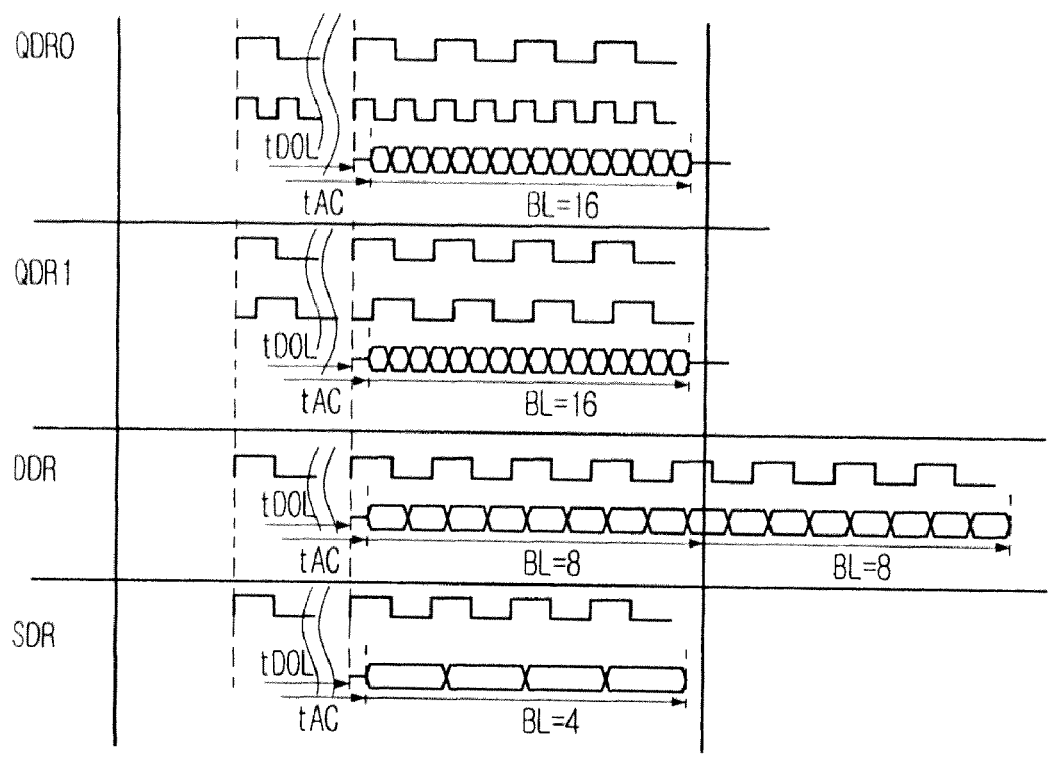
FIG. 41 is a waveform illustrating a read operation of the multi-port memory device for the DRAM core test operation mode.

FIG. 41 is a waveform illustrating a read operation of the multi-port memory device for the DRAM core test operation mode.

"BL" means a burst length, i.e., the number bits of output data. "tDOL" means a data output latency time, i.e., a delay for processing a read command in order to data stored in a memory cell. "tDOL" is defined as "tDOL=1CLK+CL". Herein, "CL" means column address strobe (CAS) latency. "tAC" means a delay required for reading the data after the "tDOL".

For the first QDR mode QDR0, the data is output at the rising edges and the falling edges of the second internal clock DCLK. For the second QDR mode QDR1, the data is output at the rising edges and the falling edges of the first and the second internal clocks TCLK and DCLK. For the DDR mode, the data is output at the rising edges and the falling edges of the first internal clock TCLK. In detail, eight bit data is input during four clocks. Each bit of the eight bit data is simultaneously written in two memory cells. Then, sixteen bit data written in the memory cell is output during the read operation. Therefore, the read operation for the DDR mode takes twice time than the other DRAM core test operation modes, e.g., QDR0, QDR0, and DDR. For the SDR mode, the data is output at the rising edges and the falling edges of the first internal clock TCLK. In case that the memory cell area of the multi-port memory device is divided four quarters, each quarter writes the same four bit data for the write operation. For the read operation, the four bit data is compressed and output as a logic high level and a logic low level according to a compression state i.e., pass or fail.

As described above, the multi-port memory device in accordance with the present invention performs the test operation by directly transmitting data between test device and the banks without passing through the ports. Therefore, the test operation is effectively performed with the test devices whose data transmission speed is relatively slower than that of the ports. Further, the test reliability is improved because the test operation is not affected by the port error. Further, the present invention employs a parallel I/O interface for the DRAM core test operation mode and provides a various DRAM test operation mode. Therefore, it is possible for the present invention to reduce a time consumption for the DRAM core test operation.

While the present invention has been described with respect to the specific embodiments, it will be apparent to those skilled in the art that various changes and modifications may be made without departing from the spirit and scope of the invention as defined in the following claims.

What is claimed is:

1. A multi-port memory device, comprising:
   a plurality of ports (PORT0-PORT3);
   a first global data bus coupled to said ports;
   a second global data bus coupled to said ports;
   an I/O controller (91-94) corresponding to each of said plurality of ports, said I/O controller configured to transmit a test signal (PO_RXD) from its corresponding port (PORT0-PORT3) to the second global data bus (GIO_IN) when the multi-port memory device performs a DRAM core test operation;
   a test I/O controller (95) which transmits a test I/O signal to the second global data bus (GIO IN) in response to an internal write command, and transmits data input from the first global data bus (GIO_OUT) in response to an internal read command; and
   a mode register set for generating a test enable signal in response to a mode register enable signal and outputting a mode selection signal which determines a data transmission mode of said test I/O signal.

2. The multi-port memory device as recited in claim 1, further comprising a clock generator for receiving an external clock and generating an internal clock based on the external clock in response to the mode selection signal.

3. The multi-port memory device as recited in claim 1, further comprising a plurality of banks, each coupled to a corresponding one of said plurality of ports, wherein the mode register enable signal is active during a test operation mode for testing a core area of said banks.

4. The multi-port memory device as recited in claim 1, wherein the test signal (P0_RXD) is input to the ports (PORT0-PORT3) through I/O pads (RXi+, RXi−, TXi+, and TXi−) and a dummy pad (S1).

5. The multi-port memory device as recited in claim 1, wherein the I/O controller (91-94) includes an input driver for receiving the test signal (P0_RXD) and an output driver for outputting the test signal (P0_RXD) to the second global data bus (GIO_IN).

6. The multi-port memory device as recited in claim 1, wherein the test I/O signal is input/output through test pads (DQ0-DQ3) coupled to said test I/O controller (95).

* * * * *